US011366066B2

(12) United States Patent
Koppenaal et al.

(10) Patent No.: US 11,366,066 B2
(45) Date of Patent: Jun. 21, 2022

(54) MULTI-ELECTRODE/MULTI-MODAL ATMOSPHERIC PRESSURE GLOW DISCHARGE PLASMA IONIZATION DEVICE

(71) Applicants: Battelle Memorial Institute, Richland, WA (US); Clemson University, Clemson, SC (US); GAA Custom Engineering, LLC, Benton City, WA (US)

(72) Inventors: David W. Koppenaal, Richland, WA (US); Ying Zhu, Richland, WA (US); Edward D. Hoegg, Arlington, VA (US); R. Kenneth Marcus, Clemson, SC (US); Gordon A. Anderson, Benton City, WA (US); Chris Anderson, Benton City, WA (US); Tyler Williams, Clemson, SC (US)

(73) Assignees: Battelle Memorial Institute, Richland, WA (US); Clemson University Research Foundation, Clemson, SC (US); GAA Custom Engineering LLC, Benton City, WA (US)

( * ) Notice: Subject to any disclaimer, the term of this patent is extended or adjusted under 35 U.S.C. 154(b) by 325 days.

(21) Appl. No.: 16/600,363

(22) Filed: Oct. 11, 2019

(65) Prior Publication Data

US 2021/0109026 A1 Apr. 15, 2021

(51) Int. Cl.
*G01N 21/67* (2006.01)
*H01J 49/10* (2006.01)
(Continued)

(52) U.S. Cl.
CPC ............. *G01N 21/67* (2013.01); *G01N 27/62* (2013.01); *G01N 27/68* (2013.01); *G01N 30/726* (2013.01);
(Continued)

(58) Field of Classification Search
CPC ........ G01N 21/67; G01N 27/62; G01N 27/68; G01N 30/7233; G01N 30/726;
(Continued)

(56) References Cited

U.S. PATENT DOCUMENTS 6,407,382 B1 6/2002 Spangler
6,852,969 B2 2/2005 Marcus et al.
(Continued)

OTHER PUBLICATIONS

Marcus et al., "Liquid sampling-atmospheric pressure glow discharge (LS-APGD) microplasmas for diverse spectrochemical analysis applications," *J. Anal. At. Spectrom*, 32:704-716 (Feb. 17, 2017).
(Continued)

*Primary Examiner* — Kiet T Nguyen
(74) *Attorney, Agent, or Firm* — Klarquist Sparkman, LLP

(57) ABSTRACT

Apparatus include an atmospheric pressure glow discharge (APGD) analyte electrode defining an analyte discharge axis into an APGD volume, and a plurality of APGD counter electrodes having respective electrical discharge ends directed to the APGD volume, wherein the APGD analyte electrode and the APGD counter electrodes are configured to produce an APGD plasma in the APGD volume with a voltage difference between the APGD analyte electrode and one or more of the AGPD counter electrodes. An electrode can be integrated into an ion inlet. Apparatus can be configured to perform auto-ignition and/or provide multi-modal operation through selectively powering electrodes. Electrode holder devices are disclosed. Related methods are disclosed.

13 Claims, 28 Drawing Sheets

(51) Int. Cl.
| | |
|---|---|
| H01J 37/32 | (2006.01) |
| G01N 27/68 | (2006.01) |
| G01N 30/72 | (2006.01) |
| G01N 27/62 | (2021.01) |
| H01J 47/12 | (2006.01) |
| H01J 61/54 | (2006.01) |

(52) U.S. Cl.
CPC .... *G01N 30/7233* (2013.01); *H01J 37/32018* (2013.01); *H01J 37/32045* (2013.01); *H01J 37/32266* (2013.01); *H01J 47/1261* (2013.01); *H01J 47/1266* (2013.01); *H01J 49/105* (2013.01); *H01J 61/542* (2013.01)

(58) Field of Classification Search
CPC ........... H01J 37/32018; H01J 37/32045; H01J 37/32266; H01J 47/1261; H01J 47/1266; H01J 49/105; H01J 49/168; H01J 61/542
USPC ........................................................ 250/288
See application file for complete search history.

(56) References Cited

U.S. PATENT DOCUMENTS

| | | | |
|---|---|---|---|
| 7,460,225 B2 | 12/2008 | Karanassios | |
| 9,536,725 B2 | 1/2017 | Marcus et al. | |
| 10,269,525 B2 | 4/2019 | Marcus et al. | |
| 2005/0012038 A1* | 1/2005 | Marcus | G01N 21/67 250/288 |
| 2009/0102886 A1* | 4/2009 | Sieber | B41J 2/1637 347/45 |
| 2017/0199130 A1* | 7/2017 | Marcus | G01N 21/67 |

OTHER PUBLICATIONS

Zhang et al., "Mass spectra of diverse organic species utilizing the liquid sampling-atmospheric pressure glow discharge (LS-APGD) microplasma ionization source," *J. Anal. At. Spectrom*, 31:145-151 (Jan. 2016).

Hoegg et al., "Concomitant ion effects on isotope ratio measurements with liquid sampling—atmospheric pressure glow discharge ion source Orbitrap mass spectrometry," *Journal of Analytical Atomic Spectrometry*, 33:251-259 (Jan. 3, 2018).

Hoegg et al., "Coupling of an atmospheric pressure microplasma ionization source with an Orbitrap Fusion Lumos Tribrid IM mass analyzer for ultra-high resolution isotopic analysis of uranium," *Journal of Analytical Atomic Spectrometry*, 34(7):1297-1524 (Jul. 2019).

Hoegg et al., "Determination of uranium isotope ratios using a liquid sampling atmospheric pressure glow discharge/Orbitrap mass spectrometer system," *Rapid Communications in Mass Spectrometry*, 31:1534-1540 (Jul. 8, 2017).

Hoegg et al., "Isotope ratio characteristics and sensitivity for uranium determinations using a liquid sampling-atmospheric pressure glow discharge ion source coupled to an Orbitrap mass analyzer," *J. Anal. At. Spectrom*, 31:2355-2362 (Sep. 8, 2016).

Hoegg, et al., "Preliminary Figures of Merit for Isotope Ratio Measurements: The Liquid Sampling Atmospheric Pressure Glow Discharge Microplasma Ionization Source Coupled to an Orbitrap Mass Analyzer," *American Society for Mass Spectrometry*, 27:1393-1403 (Apr. 14, 2016).

Marcus et al., "An Atmospheric Pressure Glow Discharge Optical Emission Source for the Direct Sampling of Liquid Media," *Analytical Chemistry*, 73(13):2903-2910 (Jul. 1, 2001).

Marcus et al., "Liquid Sampling-Atmospheric Pressure Glow Discharge Ionization Source for Elemental Mass Spectrometry," *Analytical Chemistry*, 83:2425-2429 (Feb. 28, 2011).

Quarles, Jr et al., "Liquid sampling-atmospheric pressure glow discharge (LS-APGD) ionization source for elemental mass spectrometry: preliminary parametric evaluation and figures of merit," *Analytical and Bioanalytical Chemistry*, 402:261-268 (Sep. 12, 2011).

Hoegg et al., "A multi-electrode glow discharge ionization source for atomic and molecular mass spectrometry," *Journal of Analytical Atomic Spectrometry*, 35(9):1969-1978 (Jul. 13, 2020).

Hoegg et al., "Interfacing the Liquid Sampling-Atmospheric Pressure Glow Discharge Ion Source with Orbitrap Mass Spectrometers for High Accuracy High Precision Isotope Ratio Measurements of Uranium Recommended Citation Interfacing the Liquid Sampling-Atmospheric Pressure Glow Discharge Ion Source with Orbitrap Mass," https://tigerprints.clemson.edu/cgi/viewcontent.cgi?article=3254&context=all_dissertations, 164 pages (Dec. 2018).

International Search Report and Written Opinion for related International Application No. PCT/US2020/055247, 21 pages, dated May 18, 2021.

* cited by examiner

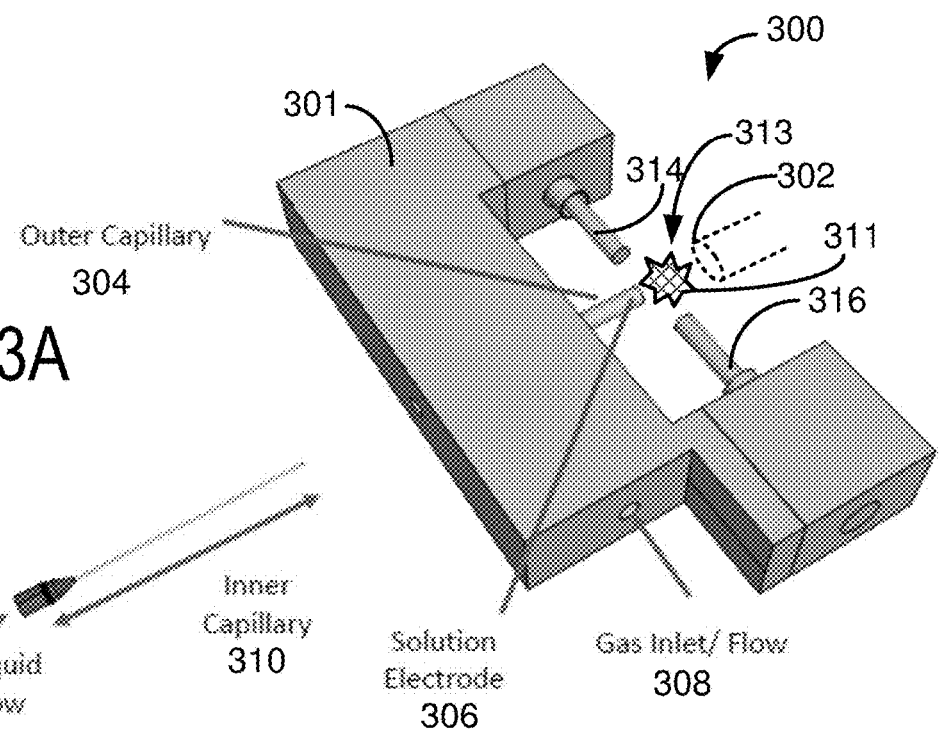
FIG. 3A
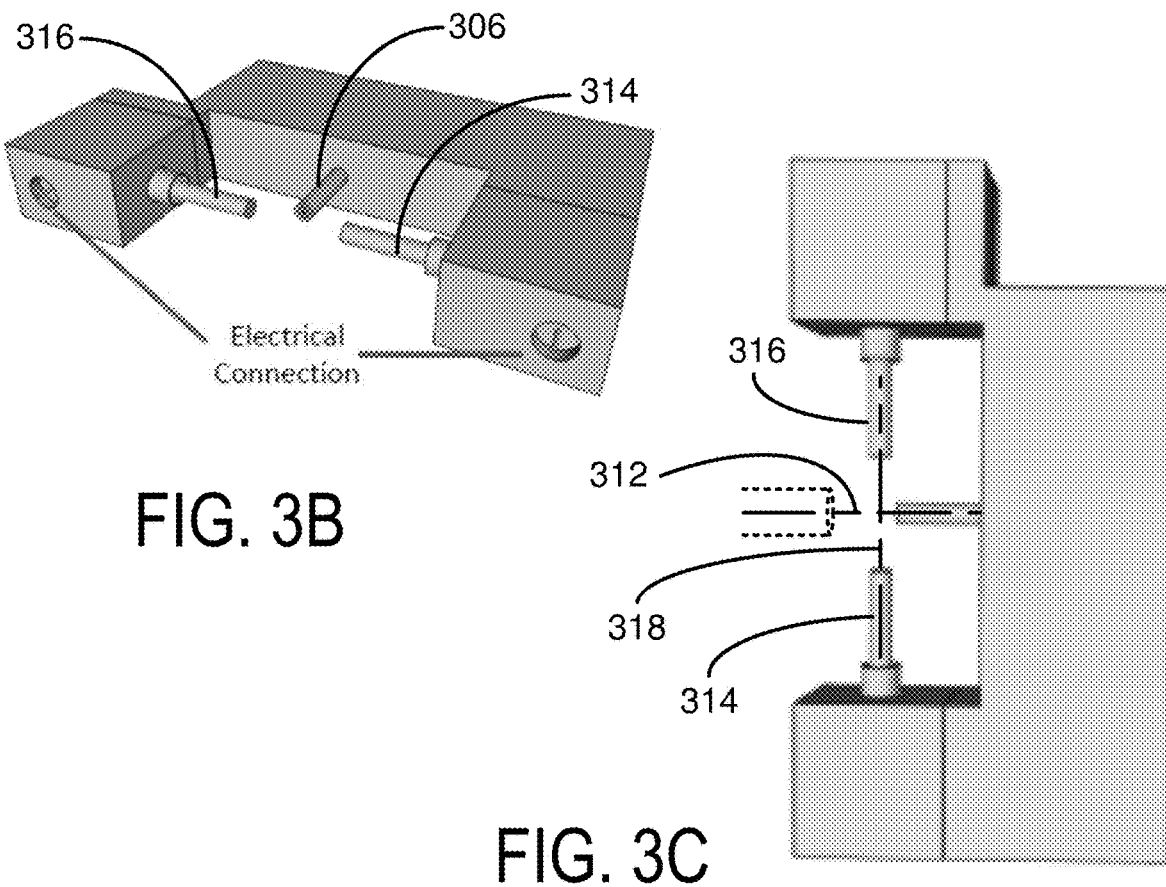
FIG. 3B
FIG. 3C

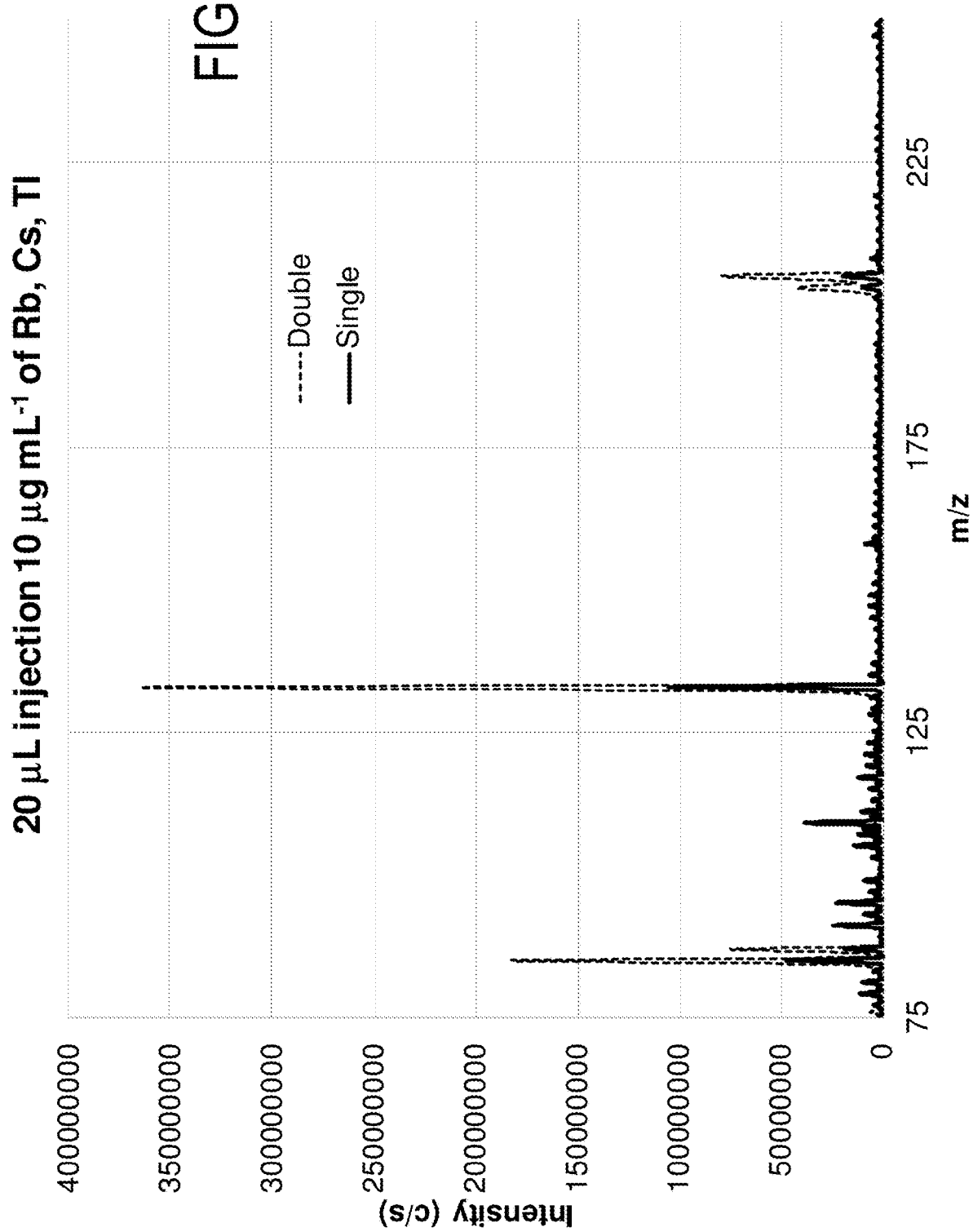

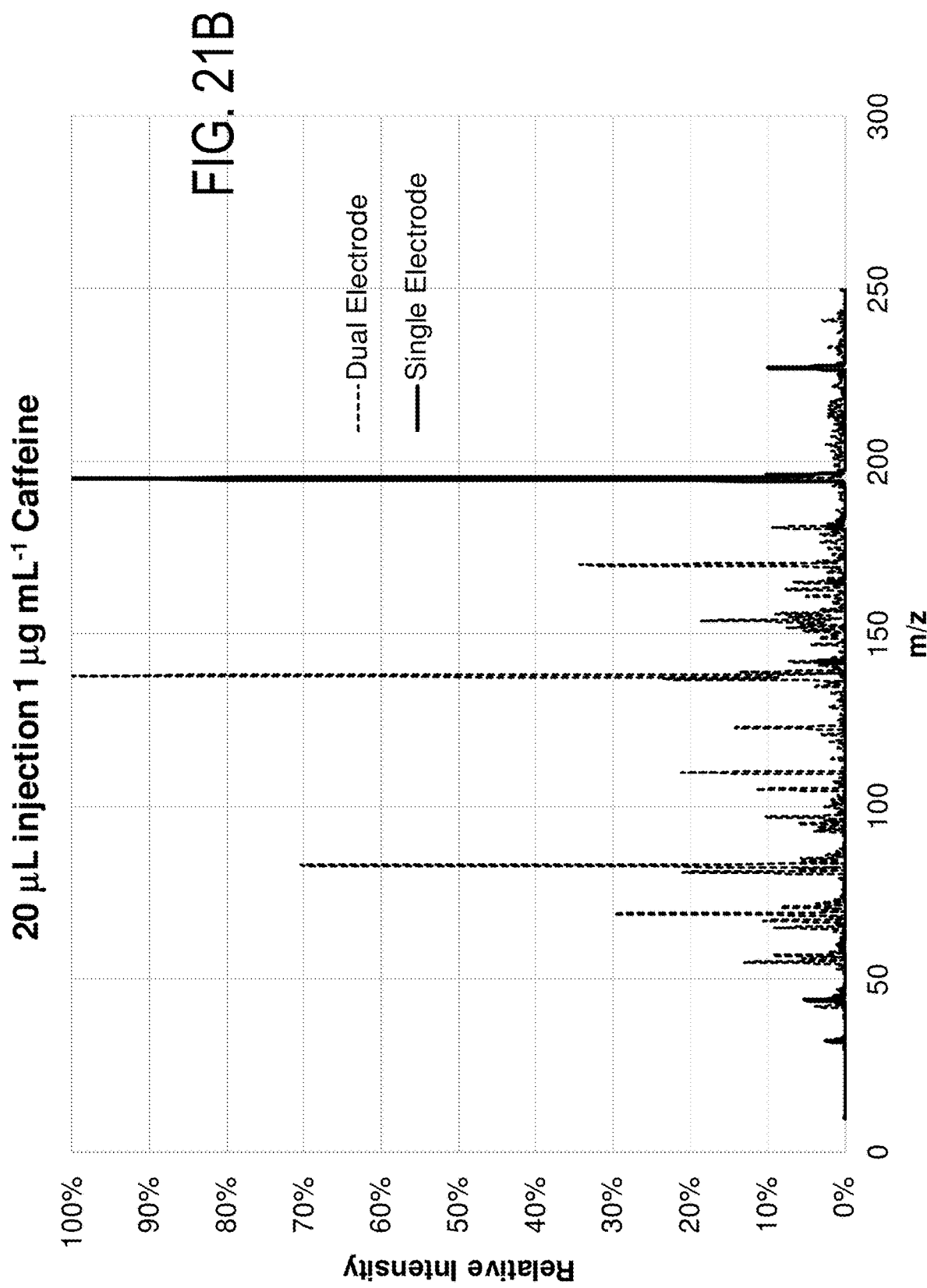

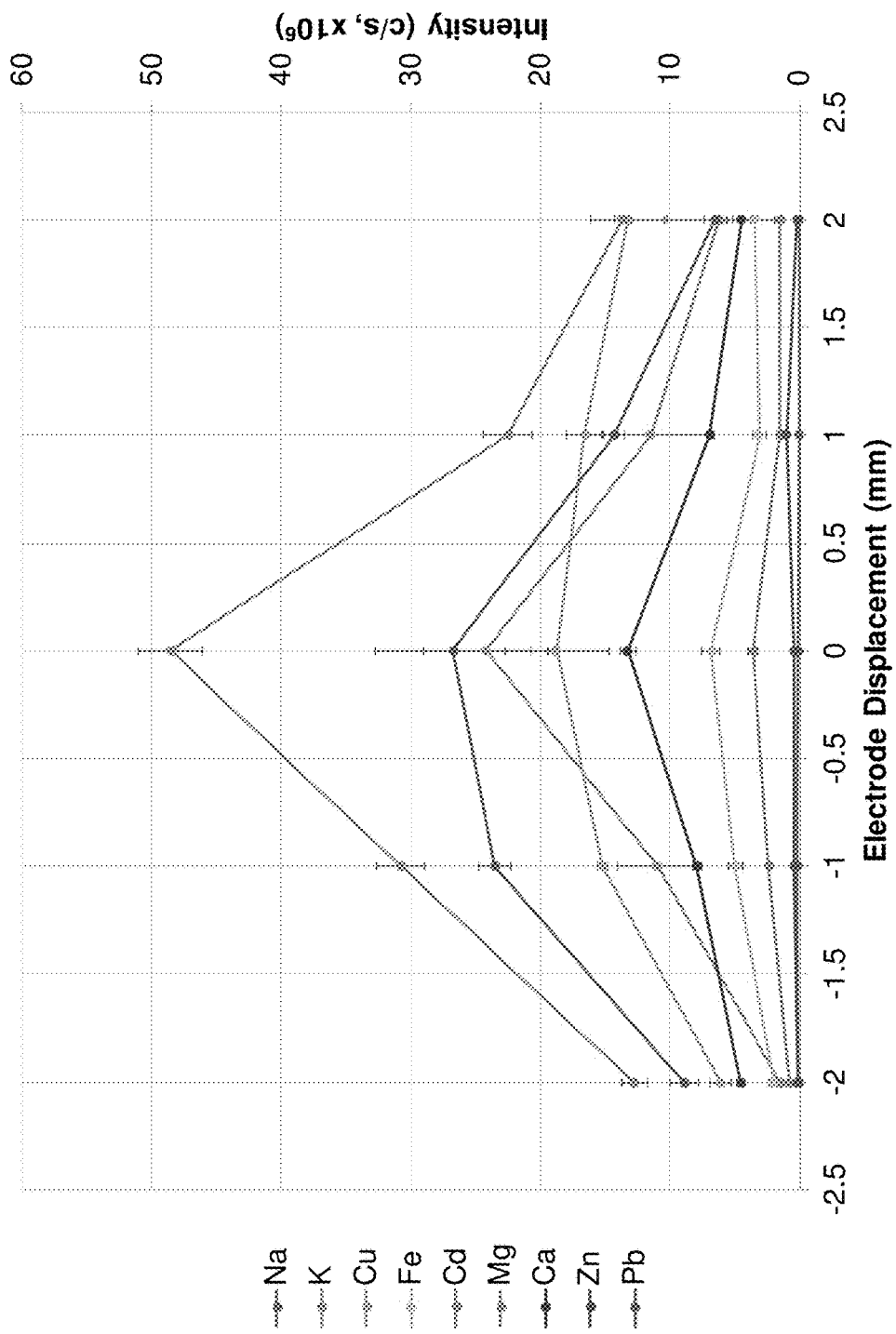
FIG. 22 Electrode Displacement From in Line with the Solution Electrode
Samples in the following figures were 5 µg mL$^{-1}$ Na, K, Fe, Cu, Cd, Mg, Ca, Zn, and Pb. Triplicate injections of 20 µL were completed for each point.

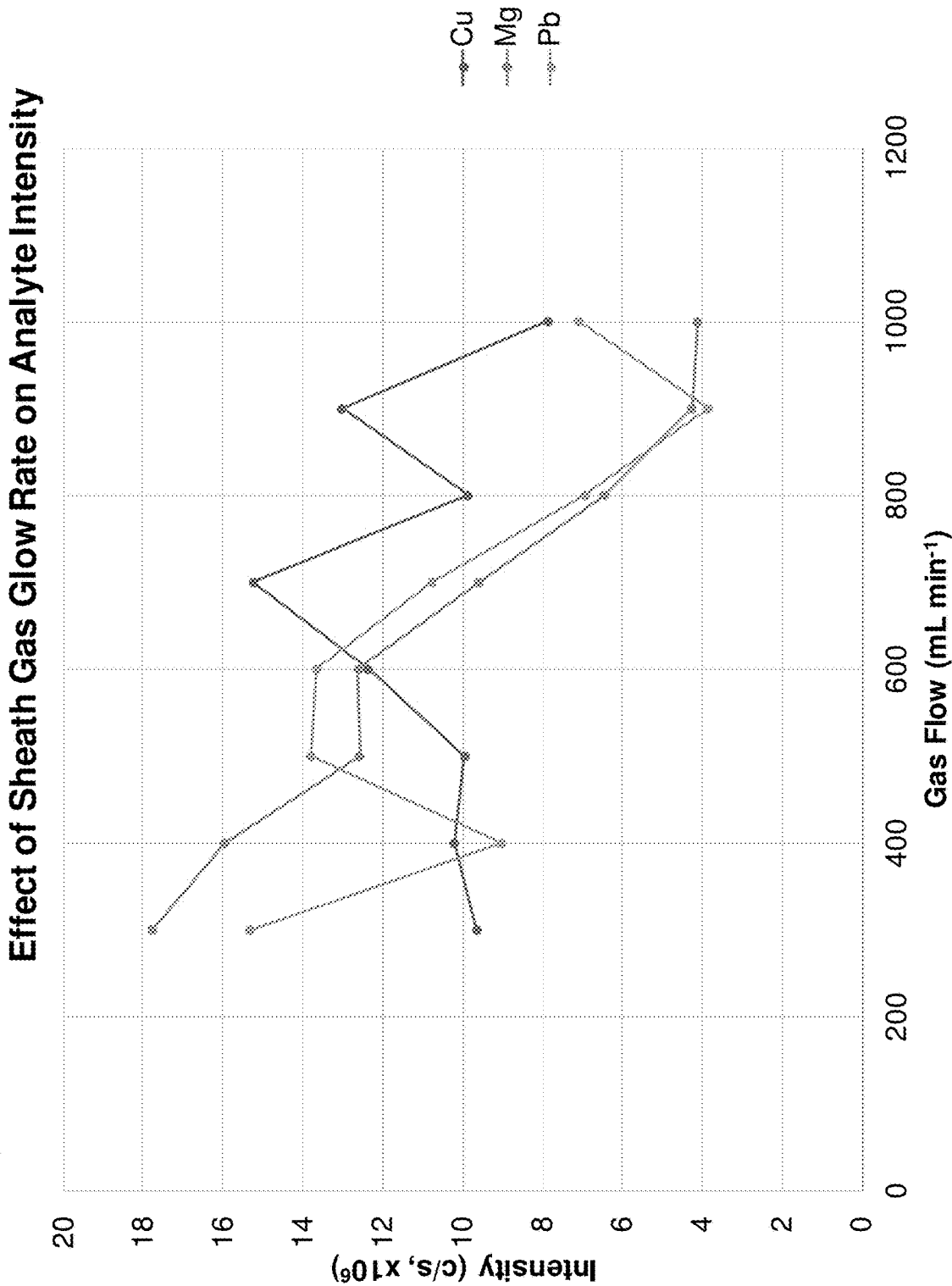

MULTI-ELECTRODE/MULTI-MODAL ATMOSPHERIC PRESSURE GLOW DISCHARGE PLASMA IONIZATION DEVICE

ACKNOWLEDGMENT OF GOVERNMENT SUPPORT

This invention was made with government support under DE-AC05-76RL01830 awarded by the U.S. Department of Energy and under HDTRA1-14-1-0010 awarded by the U.S. Department of Defense. The government has certain rights in the invention.

FIELD

The field is atomic and molecular spectrometry and analysis.

BACKGROUND

Atmospheric pressure glow discharges (APGD) are increasingly useful as ionization sources in mass spectrometry. A typical atmospheric pressure liquid sampling glow discharge of the type originally described by Marcus et al. in U.S. Pat. No. 6,852,969 can be powerful enough to ionize many organic molecules, elements, and isotopes. These devices are compact and small with plasma volumes of 1-2 $mm^3$. However, a need remains for improved devices that can be smaller, simpler to operate and maintain, less expensive, and with increased capability, flexibility, and enhanced performance.

SUMMARY

Examples of the disclosed technology include various apparatus and methods directed to electrode arrangements and related excitations, including liquid sampling atmospheric pressure glow discharges (LS-APGD).

According to an aspect of the disclosed technology, apparatus include an atmospheric pressure glow discharge (APGD) analyte electrode defining an analyte discharge axis into an APGD volume, and a plurality of APGD counter electrodes having respective electrical discharge ends directed to the APGD volume, wherein the APGD analyte electrode and the APGD counter electrodes are configured to produce an APGD plasma in the APGD volume with a voltage difference between the APGD analyte electrode and one or more of the AGPD counter electrodes. In some examples, the plurality of APGD counter electrodes includes first and second APGD counter electrodes opposing each other with the respective ends arranged along respective counter electrodes axes that intersect each other and the analyte discharge axis. In some examples, the counter electrode axes are collinear and perpendicular to the analyte discharge axis. In some examples, the plurality of APGD counter electrodes includes third and fourth APGD counter electrodes opposing each other with the respective ends arranged along respective counter electrodes axes that intersect each other and the analyte discharge axis. In particular examples, the counter electrode axes of the first and second electrodes are collinear and perpendicular to the analyte discharge axis and the counter electrode axes of the third and fourth electrodes are collinear and perpendicular to the analyte discharge axis and the counter electrodes axes of the first and second electrodes. However, various examples can include electrodes axes arranged at various angles to each other. Some examples further include a first capillary configured to discharge the analyte into the APGD volume and a second capillary configured to discharge an electrolyte into the APGD volume. For example, the APGD analyte electrode can be formed as a portion of the first capillary and one of the APGD counter electrodes can be formed as a portion of the second capillary. Any of the preceding examples can include a capillary including the APGD analyte electrode formed as a portion of the capillary, wherein the capillary is configured to discharge the analyte as a gas analyte or aerosolized analyte into the APGD volume. In any of the preceding examples, at least one of the APGD analyte or APGD counter electrodes can be movable so as to vary a characteristic of the APGD volume. Any of the preceding examples can include a power supply electrically coupled to at least one of the APGD analyte electrode or APGD counter electrodes and configured to power the at least one electrode to produce an APGD plasma in the APGD volume, and an ion inlet coupled to the APGD volume and situated to receive ions generated in the plasma. In any of the preceding examples, the electrical discharge ends can be arranged to reduce a washout time of the apparatus. In any of the preceding examples, the APGD analyte electrode and the APGD counter electrodes can be configured to produce a non-APGD analyte excitation for optical emission spectroscopy. Any of the preceding examples can further include an outer capillary configured to discharge a sheath gas, wherein the APGD analyte electrode is formed on the outer capillary, and an inner capillary surrounded by the outer capillary and configured to discharge the analyte into the APGD volume.

According to another aspect of the disclosed technology, apparatus include an atmospheric pressure glow discharge (APGD) analyte electrode, and an ion inlet defining an ion output aperture and situated opposing the APGD analyte electrode to define a volume, wherein the ion inlet includes an APGD counter electrode, wherein the APGD analyte electrode and the APGD counter electrode are configured to produce an APGD plasma in the volume with a voltage difference applied to the APGD analyte electrode and the AGPD counter electrode. Some examples further include an electrode holder body supporting the AGPD analyte electrode. In some examples, the ion inlet is formed as part of the electrode holder body. In some examples, the ion inlet is an inlet of an external device and the electrode holder body is configured to mount to the external device. In selected examples, the external device is a mass spectrometer, or an ion lens or guide. In any of the preceding examples, the APGD counter electrode is an edge or surface proximate the ion output aperture.

According to a further aspect of the disclosed technology, apparatus include a plurality of atmospheric pressure glow discharge (APGD) electrodes situated in an arrangement for producing an APGD plasma in an APGD volume, and at least one multi-modal electrical power supply coupled to at least one of the APGD electrodes and configured to selectively provide electrical power to the respective APGD electrodes during the producing the APGD plasma. Some examples further include a processor and memory configured with processor-executable instructions that cause the at least one multi-modal electrical power supply to selectively provide the electrical power to at least one of the APGD electrodes according to a multi-modal plasma generation profile. In some examples, the memory includes instructions that cause the selection of the multi-modal plasma generation profile based on a user input to produce a degree of ionization in the APGD volume associated with an atomic versus molecular mass spectrometer characterization capability. In some examples, the plurality of APGD electrodes includes a plurality of APGD counter electrodes arranged with respective electrical discharge ends directed into the APGD volume where the APGD plasma is produced. In some examples, the selectively providing the electrical power includes powering fewer than all of a plurality of APGD counter electrodes, powering at least two of a plurality of APGD counter electrodes, or varying the power to one or more APGD counter electrodes during the producing of the plasma. In some examples, the discharge ends are directed along respective axes that intersect each other in the AGPD volume. In some examples, the discharge ends are directed along respective axes that are perpendicular to at least portion of an ion flow axis extending from a capillary to an ion inlet. Some examples further include a solution capillary configured to discharge a solution into the APGD volume including a solution electrode corresponding to one of the APGD electrodes and configured as an anode or cathode in relation to one or more of the other APGD electrodes, and an ion inlet configured to receive ions generated in the APGD volume. In some examples, the solution capillary is situated opposing the ion inlet along a solution discharge axis that is collinear with an inlet axis of the ion inlet. Some examples can further include a flow pump coupled to one or more of an analyte, electrolyte, sheath gas, or an internal standard, and configured to vary a corresponding flowrate into the APGD volume. In some examples, the variation in flowrate is synchronized with the selectively providing the electrical power to at least one of the APGD electrodes. In some examples, the at least one multi-modal electrical power supply or another electrical power supply is configured to produce one or more high voltage auto-ignition waveforms during an APGD ignition phase to initiate formation of the APGD plasma in the APGD volume. In some examples, the at least one multi-modal electrical power supply is configured to supply a DC, AC, RF, pulsed, or a combination of DC, AC, RF, and/or pulsed.

According to another aspect of the disclosed technology, an atmospheric pressure glow discharge (APGD) electrode arrangement comprising a plurality of APGD electrodes, and a power supply electrically coupled to at least one of the AGPD electrodes and configured to produce one or more high voltage pulses during an APGD ignition phase to initiate formation of a plasma in an APGD volume defined by the electrode arrangement. In some examples, the power supply is configured to synchronize the one or more high voltage pulses with introduction of an analyte solution into the APGD volume.

According to a further aspect of the disclosed technology, apparatus include an electrode holder body configured to hold at least one atmospheric pressure glow discharge (APGD) electrode in a predetermined position, wherein the electrode holder body includes one or more surfaces configured to interface the electrode holder body to an instrument such that an APGD volume defined by the predetermined position of the electrode is situated in a predetermined relation to an ion inlet of an instrument. Any of the holder examples herein can further include a cover configured to extend over the APGD electrode in the predetermined position. In some examples, the cover is configured to extend over the APGD electrode to increase a plasma stability by reducing an impact of small atmospheric pressure perturbations during the production of an APGD in the APGD volume. In some examples, the cover forms an air-tight seal around the APGD volume. In some examples, the cover extends over the APGD to volume so as to provide a cleaner ambient environment in the vicinity of a plasma generated in the APGD volume to reduce an entrainment of atmospheric constituents in the plasma, and to allow a faster washout of samples with reduced analytical memory effects and higher sample throughput. In some examples, the electrode holder body includes one or more supports configured to hold an electrode chip supporting the at least one atmospheric pressure glow discharge (APGD) electrode in the predetermined position. In some examples, the electrode holder body includes at least one of an electrical connection port configured to receive an electrical power plug, a sheath gas port configured to receive a sheath gas, or an analyte port configured to receive an analyte. In some examples, the one or more supports includes electrical contacts configured to electrically couple to electrical contacts on the electrode chip to provide electric power to the at least one APGD electrode. In some examples, the one or more supports includes a gas coupling interface configured to couple to a gas coupling interface on the electrode chip to direct the sheath gas through the electrode chip and out an orifice of at least one of the APGD electrodes. In some examples, the electrode holder body includes an orifice configured to direct sheath gas received from the sheath gas port into the APGD volume. In some examples, the one or more supports includes an analyte coupling interface configured to couple to an analyte coupling interface on the electrode chip to direct the analyte through the electrode chip and out an orifice of at least one of the APGD electrodes. In some examples, the holder body includes an APGD device cartridge having opposing electrode arrangement and input port ends, wherein the electrode arrangement end is shaped to be received at an instrument ion source input.

Many apparatus and method examples can be used separately or in combination. For example, auto-ignition methods can be used in any apparatus described herein, and can be used in addition to multi-modal methods, and any of the holder examples can be used with any of the apparatus and methods described herein, etc.

The foregoing and other objects, features, and advantages of the disclosed technology will become more apparent from the following detailed description, which proceeds with reference to the accompanying figures.

BRIEF DESCRIPTION OF THE DRAWINGS

FIG. 3A-3C are two perspective views and a top view of a newly demonstrated dual-electrode LS AGPD device example.

9A and 9C were taken using large digitization ranges and 9B and 9D were taken using narrow digitization ranges.

Figure 10:
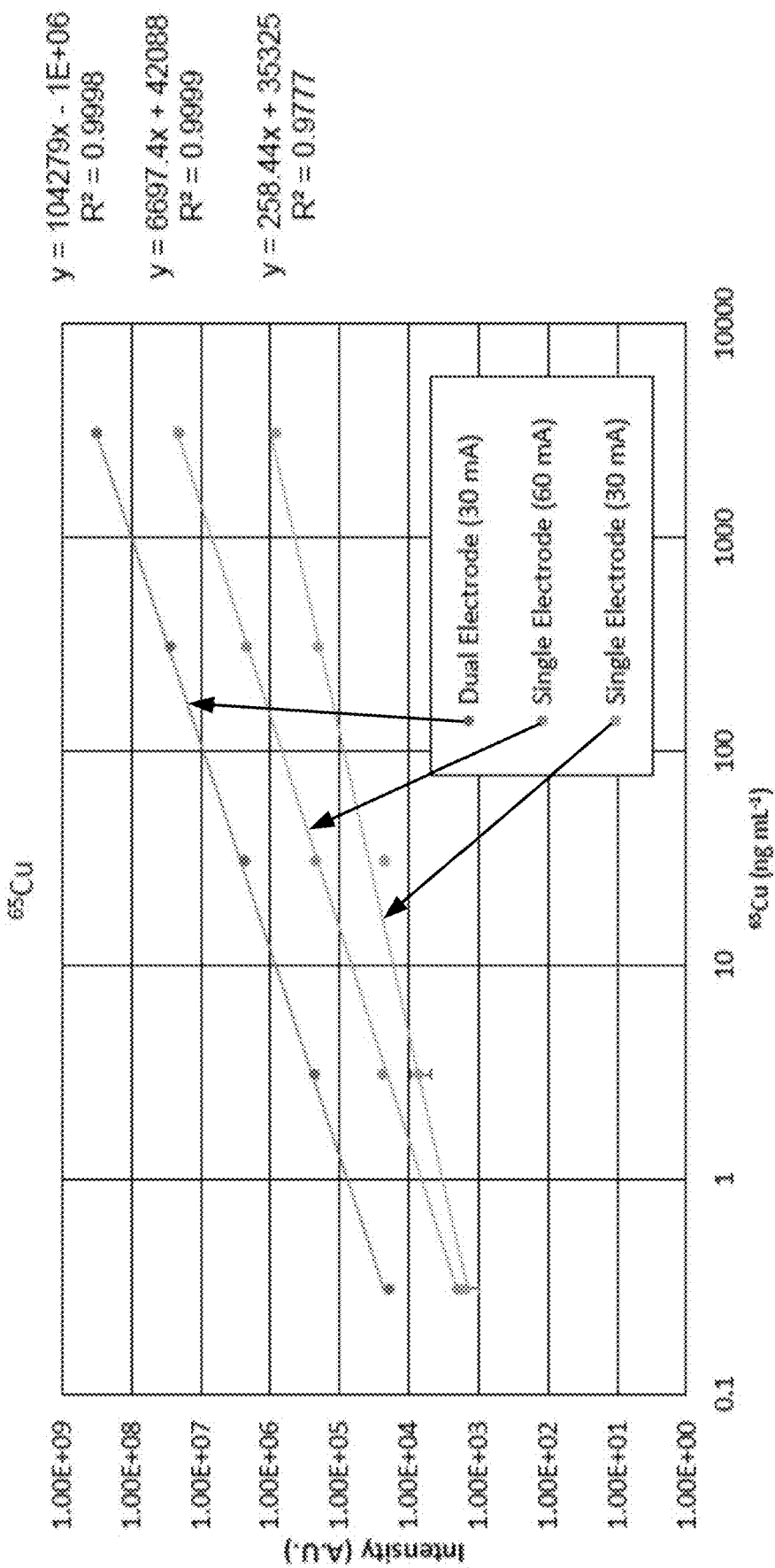
Figure 11:
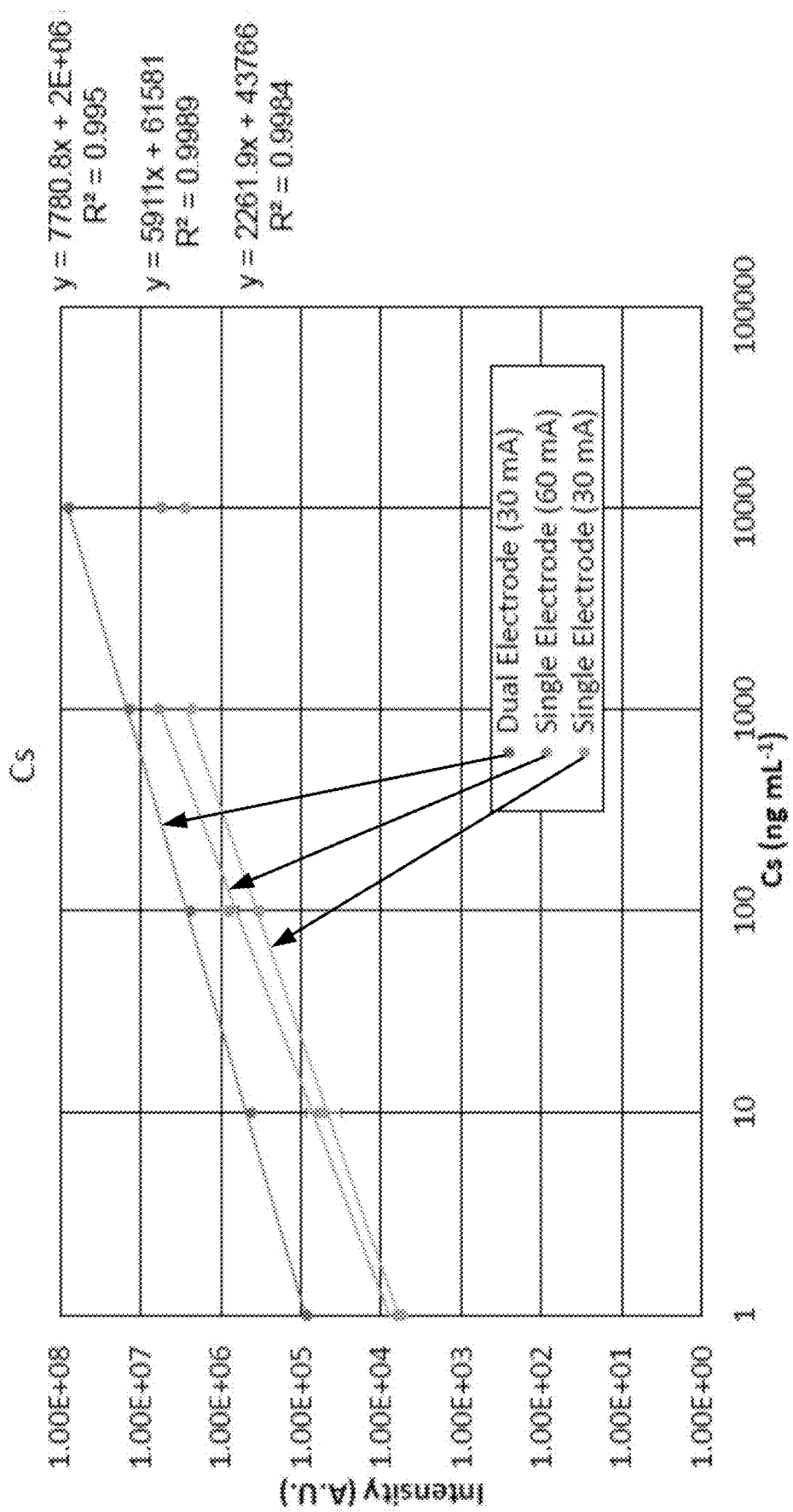
Figure 12:
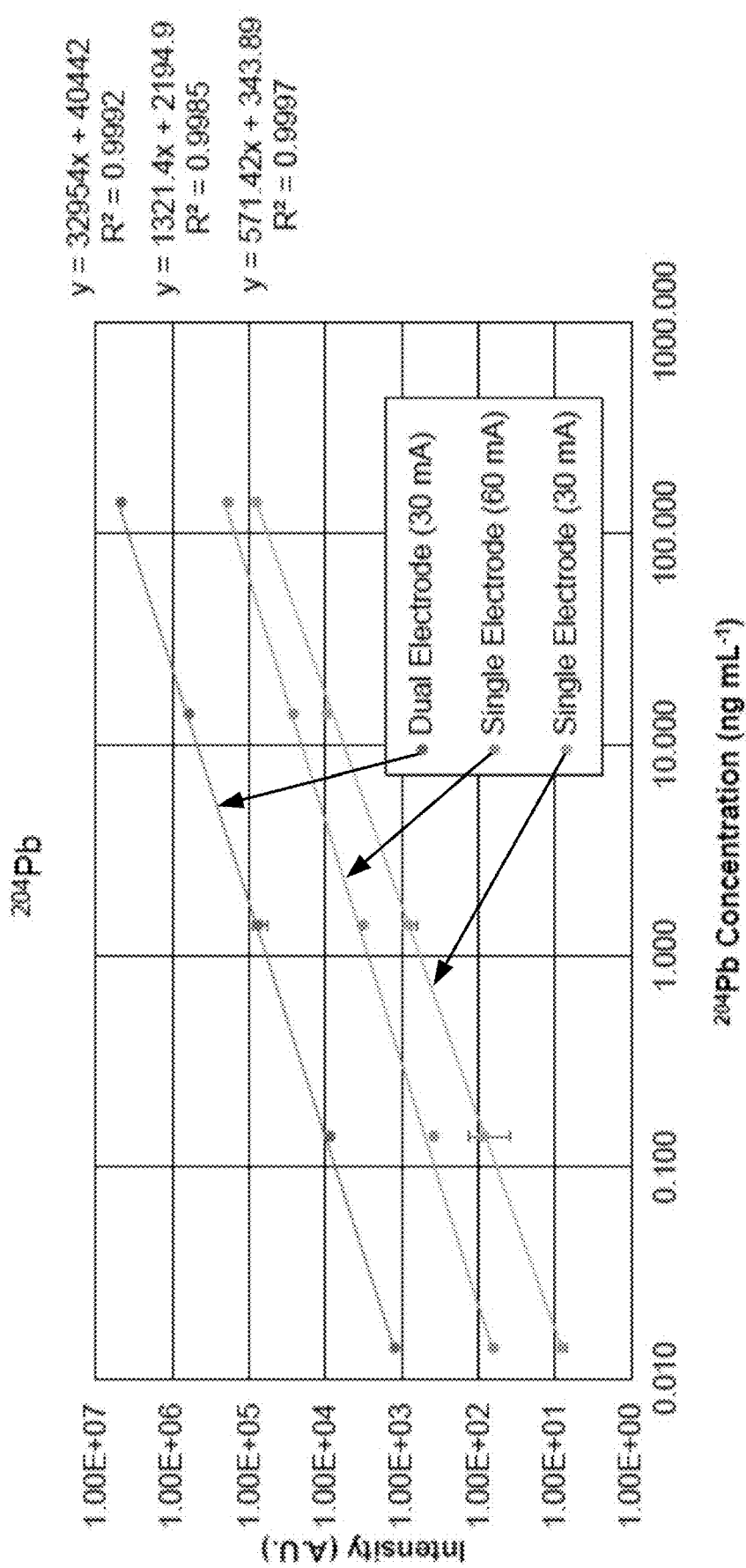

FIGS. 10-12 are graphs of sensitivity performance for Cu, Cs, and Pb for single- and dual-electrode LS-APGD devices.

Figure 13:
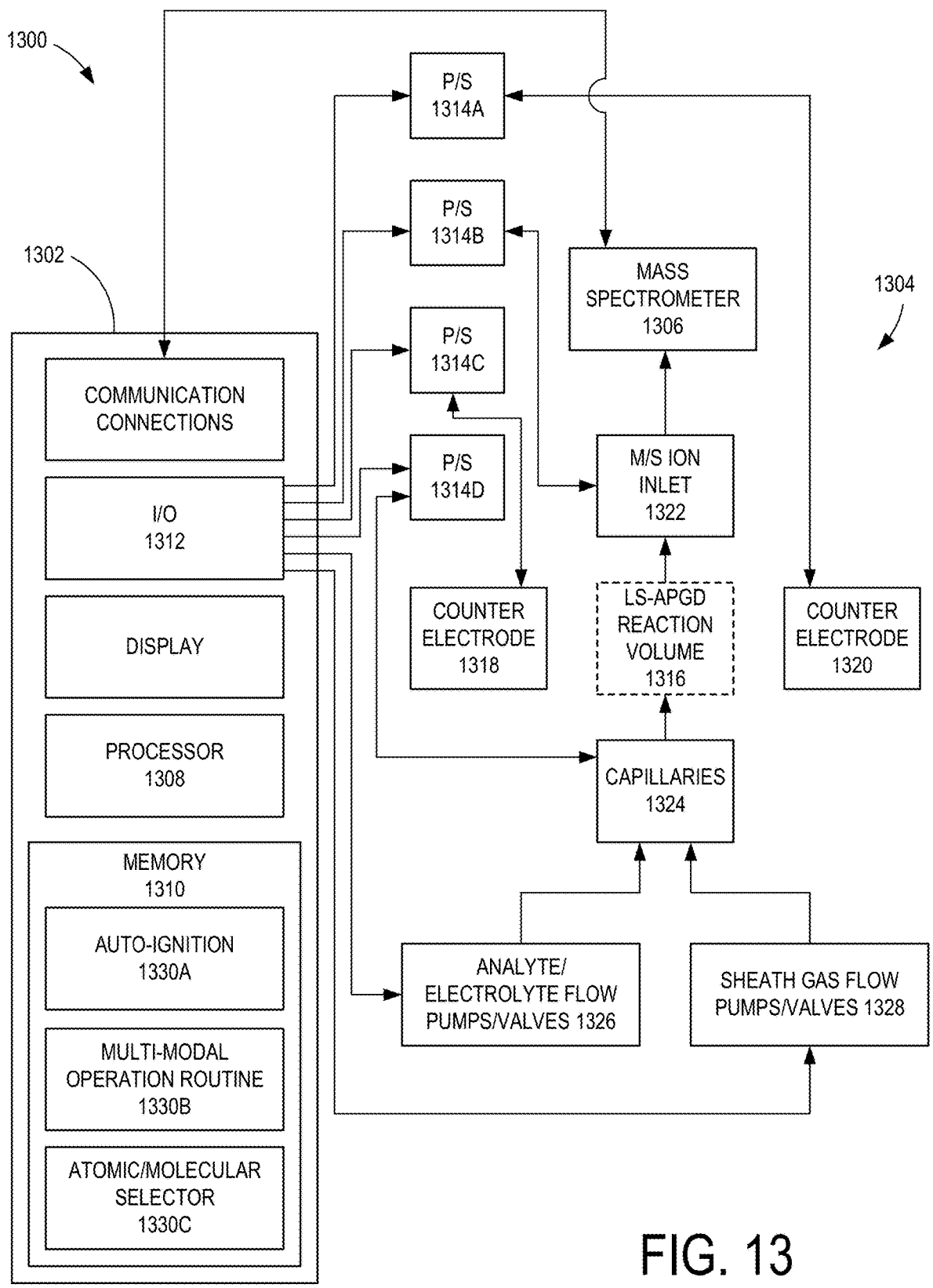

FIG. 13 is a schematic of an example LS-APGD ion source and mass analyzer control and operational system.

Figure 14:
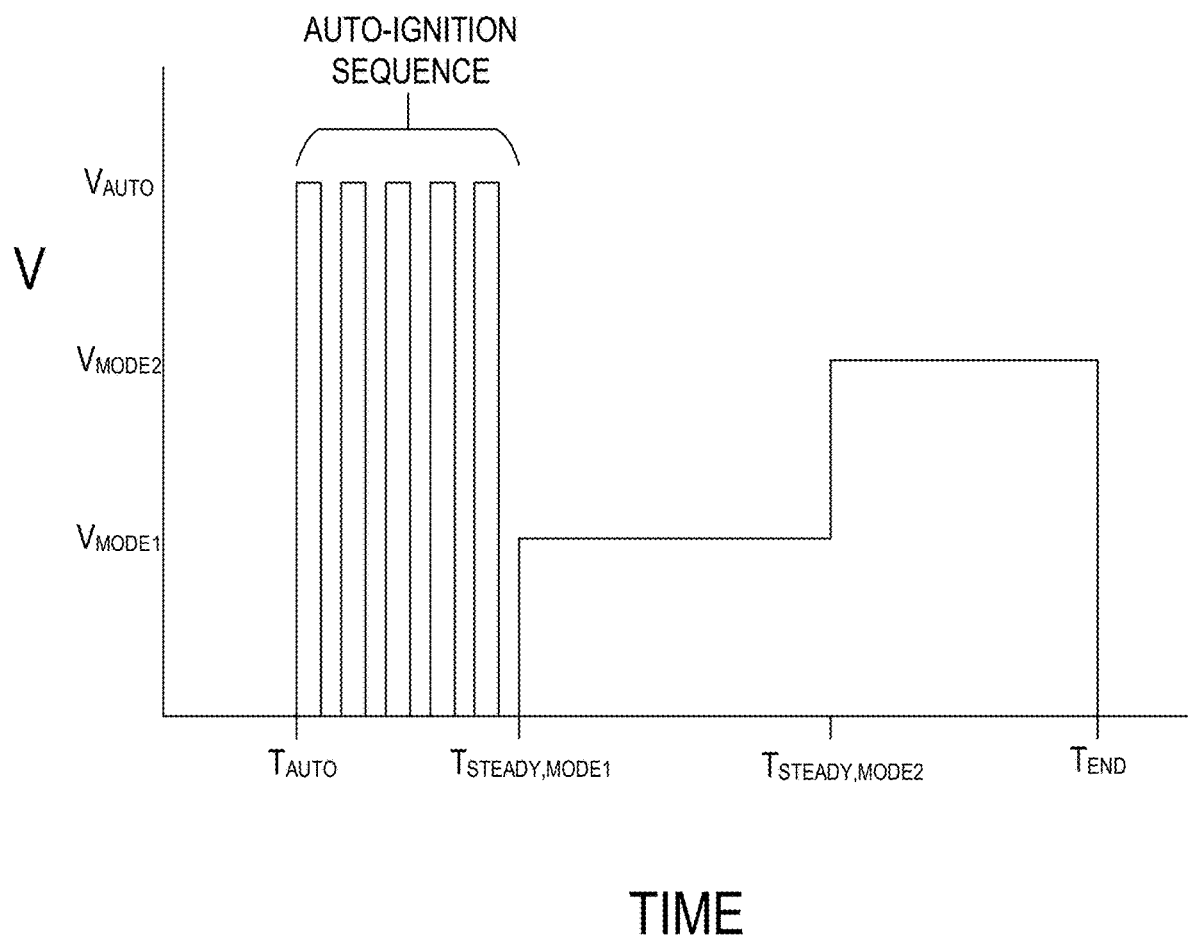

FIG. 14 is a graph of applied electrode voltage during an auto-ignition sequence for automated LS-APGD plasma generation and operation.

Figure 15:
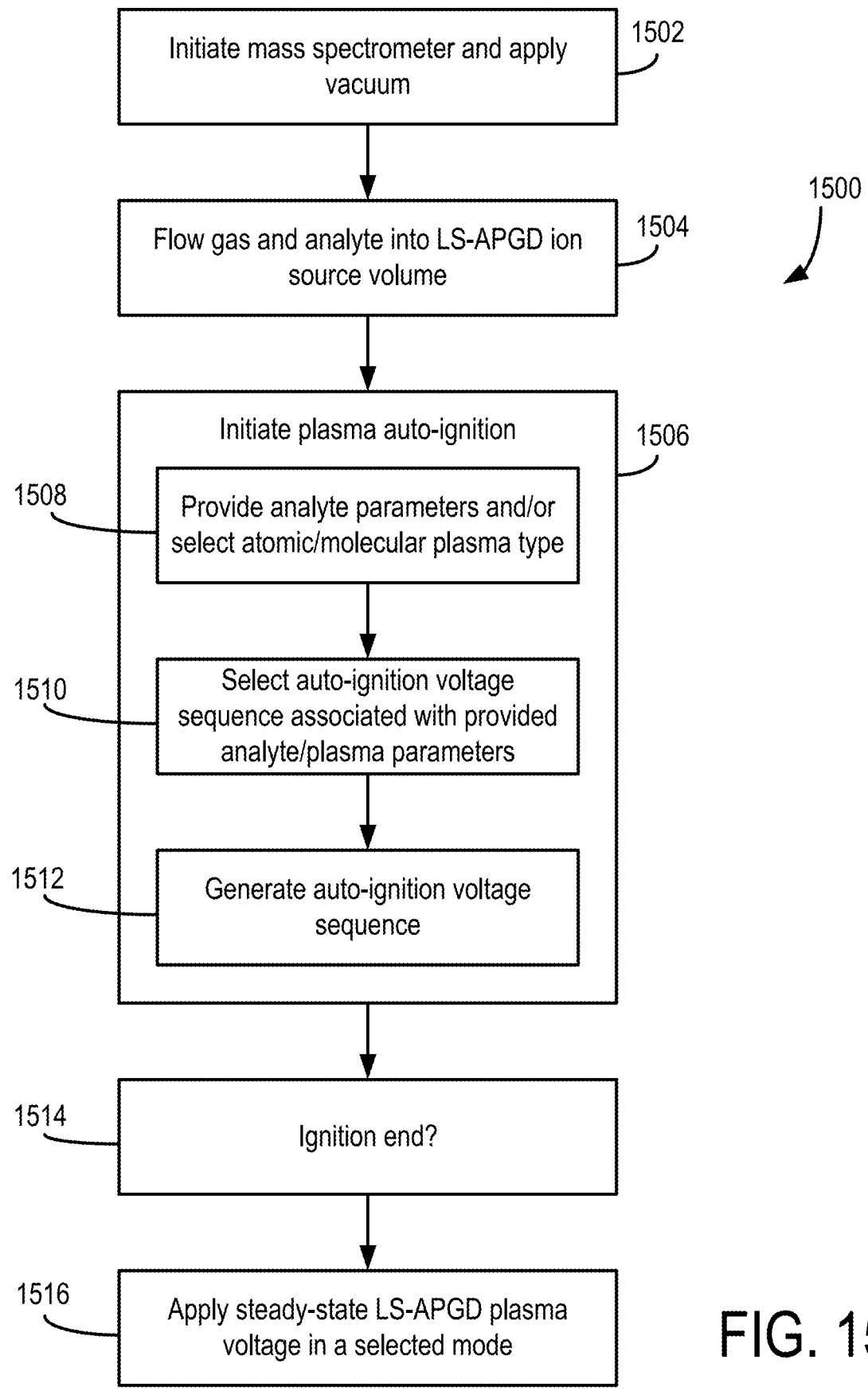

FIG. 15 is a process/logic flowchart of a method of auto-igniting a LS-APGD plasma.

Figure 16:
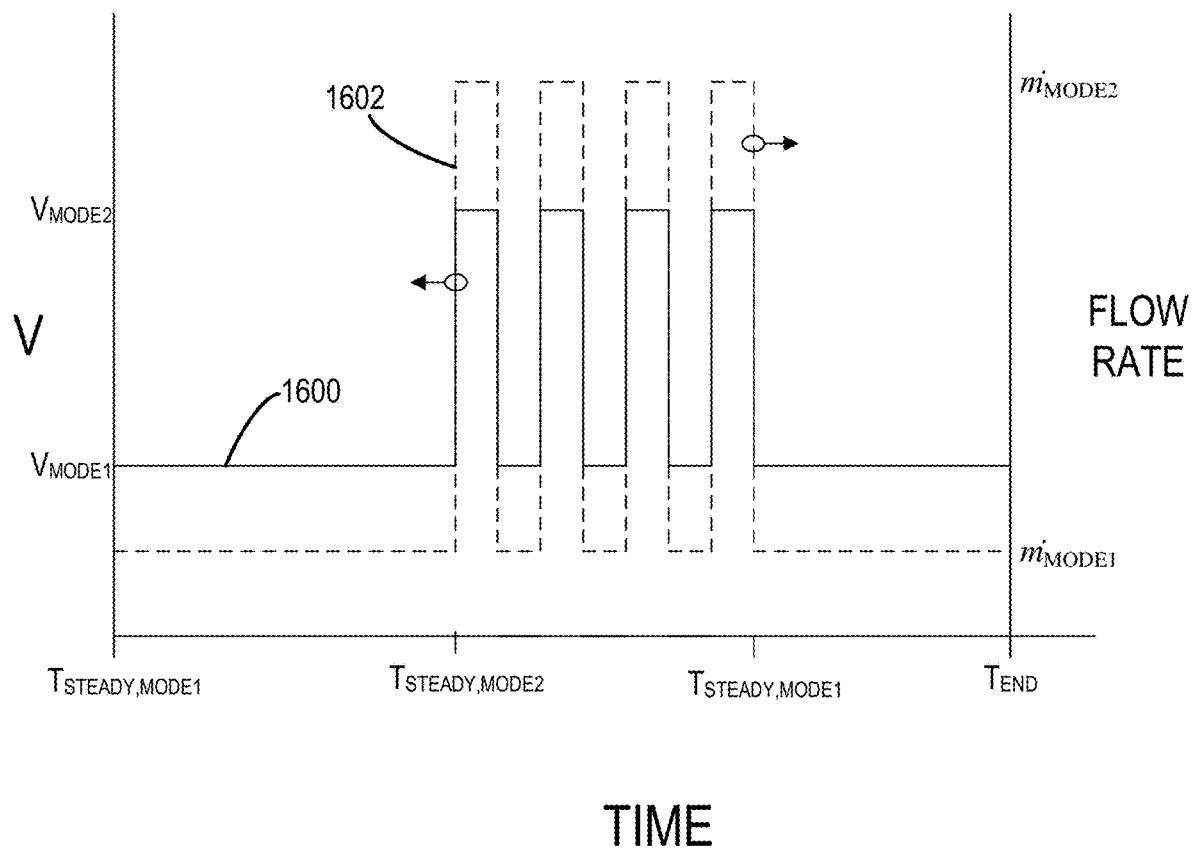

FIG. 16 is a graph of an applied electrode voltage and a flow rate (analyte and/or electrolyte) during a pulsed LS-APGD plasma generation operation.

FIGS. 17A-17D are schematics of example operational configurations for various LS-APGD device examples.

Figure 18:
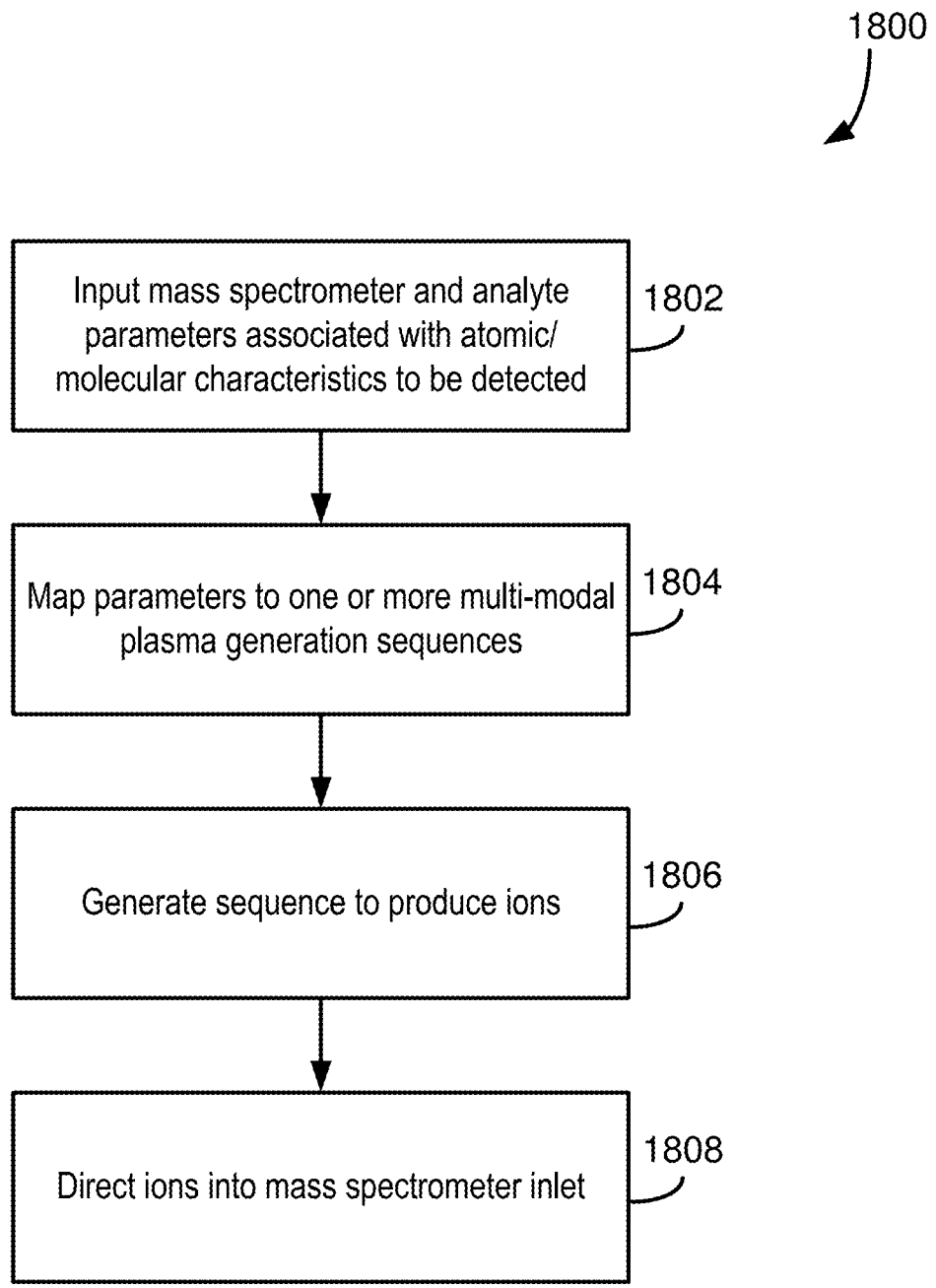

FIG. 18 is a process/logic flowchart of multi-modal LS-APGD operation.

Figure 19:
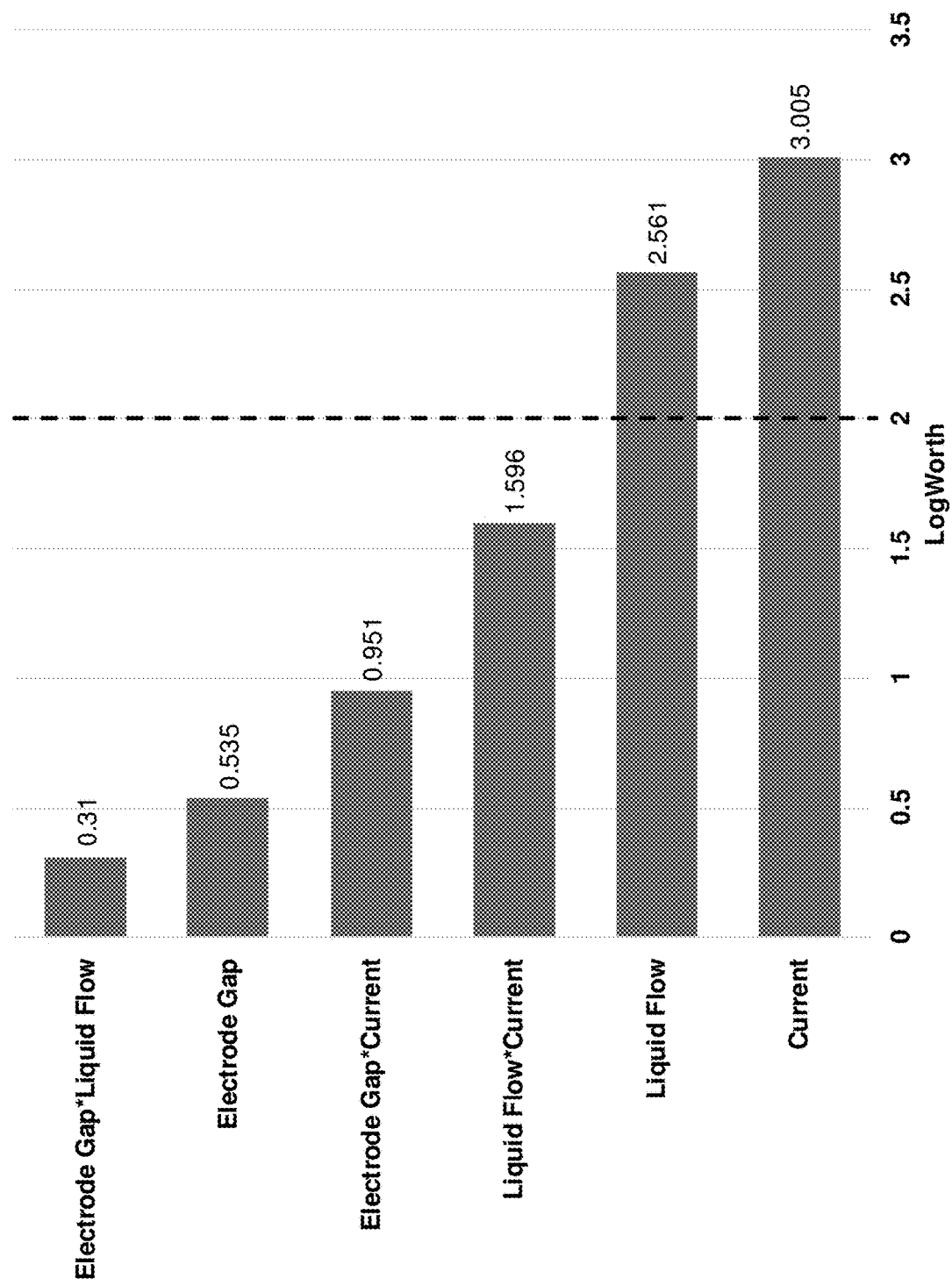
Figure 20:
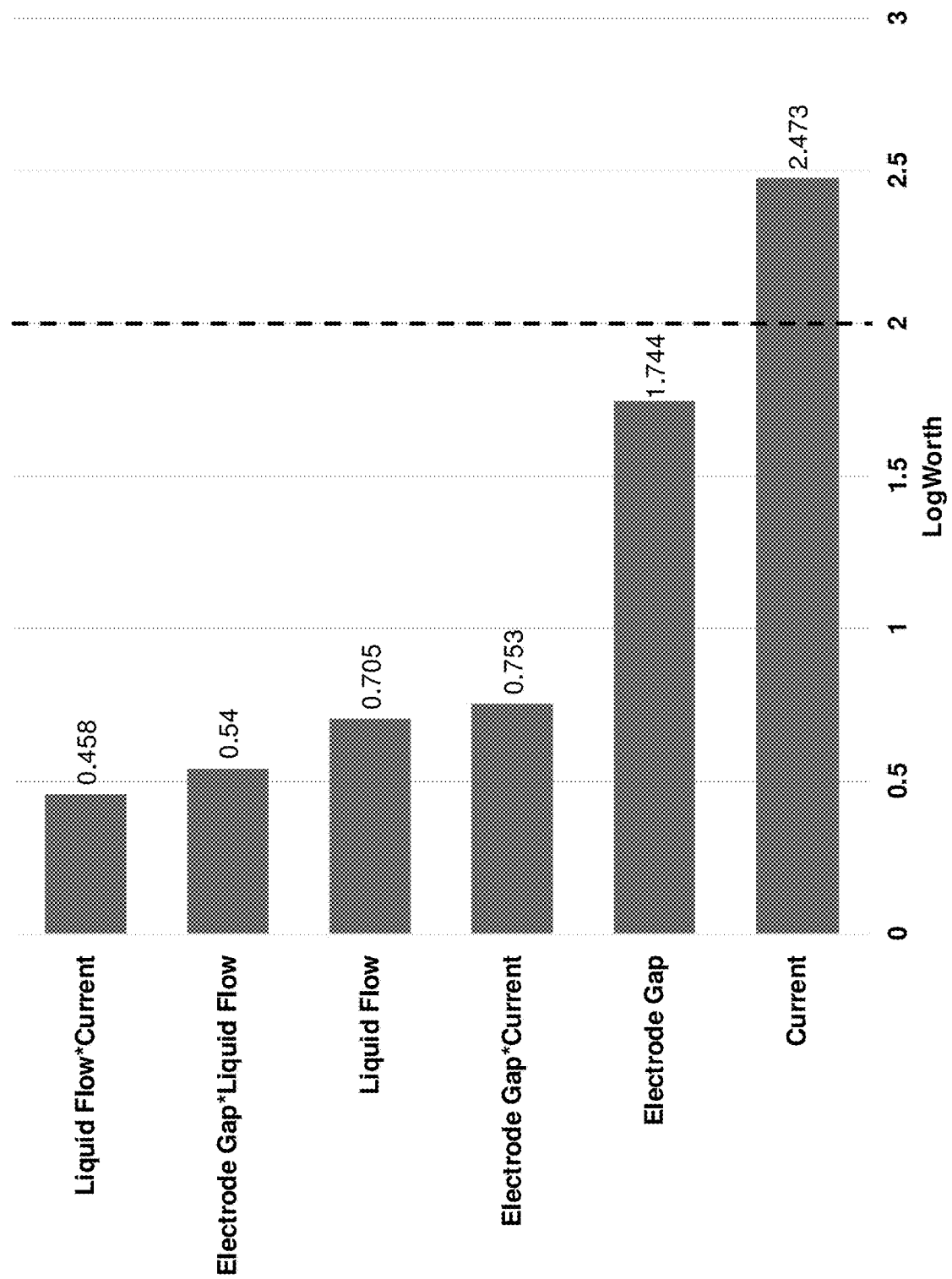

FIGS. 19-20 are graphs of logworth statistical significance of various parameters and parameter combinations for analyte signal intensities and their signal-to-background characteristics, respectively for a single solution electrode embodiment.

FIGS. 21A-21B are graphs comparing single counter electrode and dual counter electrode embodiments mass spectra performance taken on a single quadrupole instrument for elemental and molecular analytes.

Figure 23:
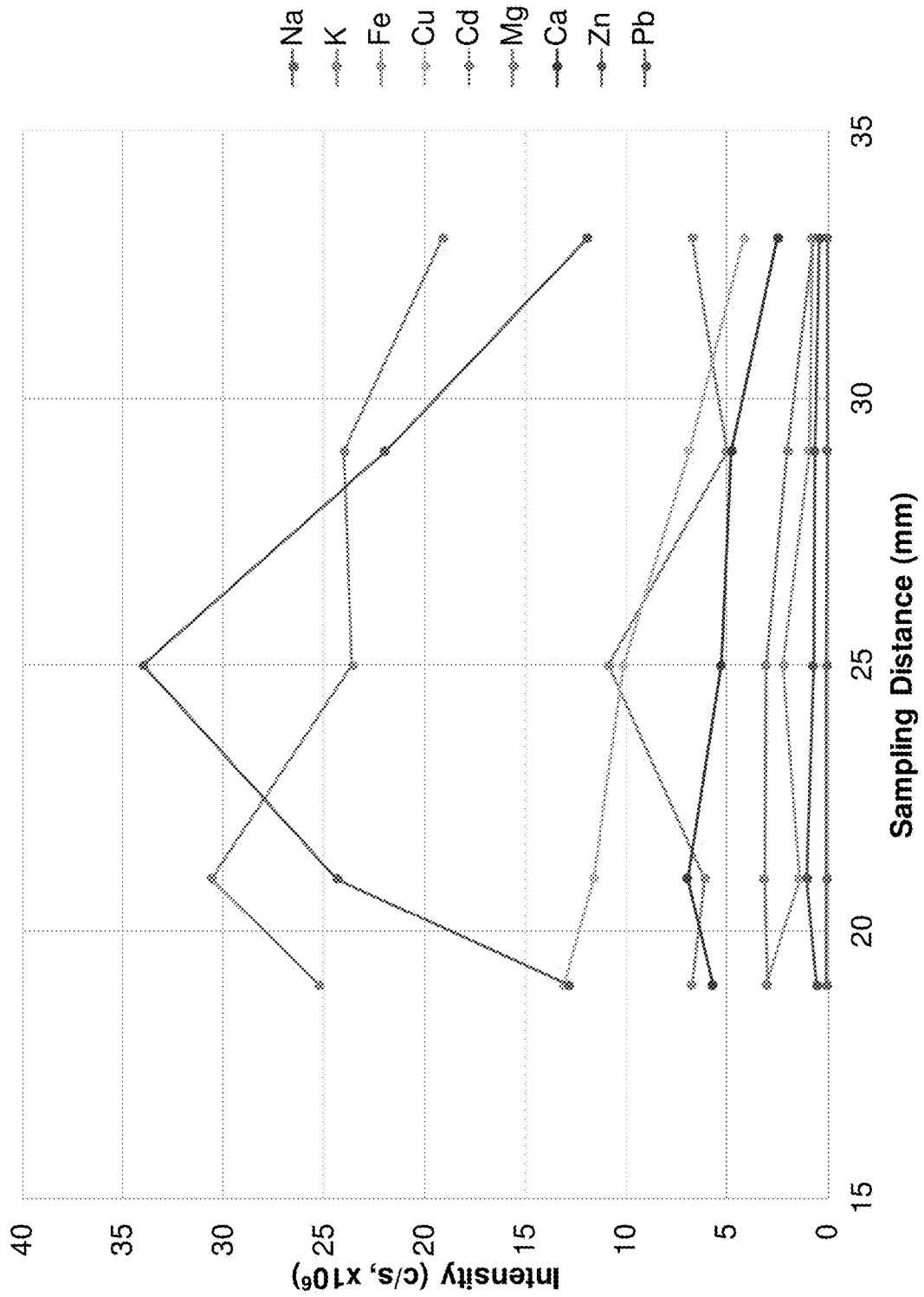

FIGS. 22-24 are graphs of experimental results showing performance variation with respect to electrode positioning.

Figures 25A, 25B, 25C:
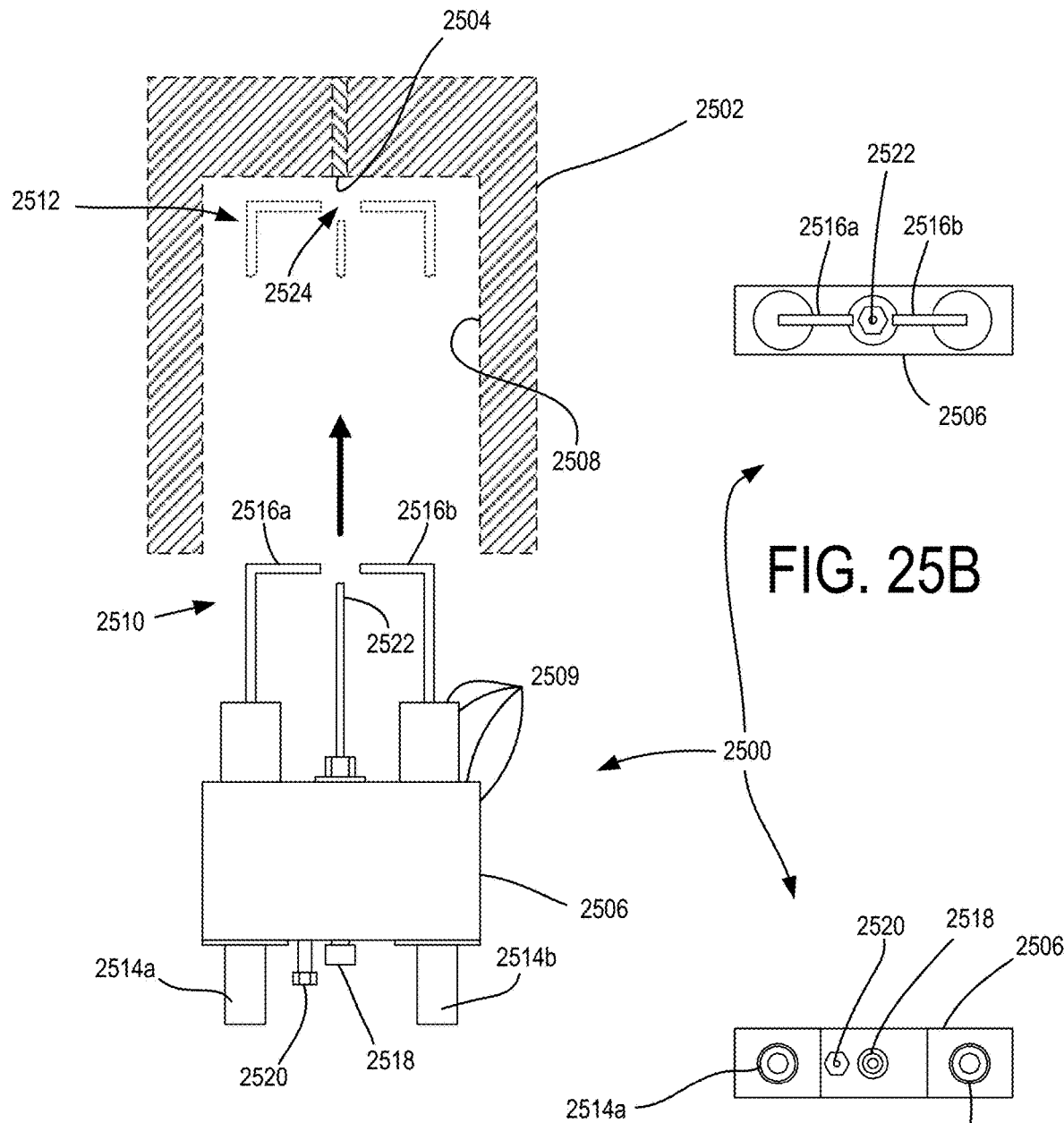

FIGS. 25A-25C are top and end views respectively of additive-manufactured/3D-printed dual-electrode LS-APGD device that can be easily and conveniently produced.

DETAILED DESCRIPTION

As described herein, examples of the disclosed technology include new and different glow discharge (GD) electrode geometries and configurations that can provide improvements in analytical performance and operational use, allowing for increased and wider acceptance of GD technology. Examples of such disruption of the current state of the art include the possibility for MS instrument users to retrofit their systems to use GD microplasma to achieve levels of performance similar to inductively coupled plasma (ICP) and other MS instruments that cost hundreds of thousands of dollars, have heavy vacuum or other technical requirements, and typically require dedicated operators. In some disclosed examples, use of a single, integrated electrode arrangement offers coupling and operational flexibility advantages. Selected applications can benefit from higher plasma power and increased plasma volume, e.g., samples that are chemically intractable or applications that require higher sample input loadings, and disclosed examples using multiple electrodes can produce plasmas by providing higher excitation/ionization power and larger plasma volumes, and such plasmas can be optimal in various respects. Disclosed examples can produce higher dissociation and ionization efficiency, more uniform and consistent plasma sampling, and can offer options in terms of the introducing a diversity of analyte/internal standard streams.

Sources for emission spectroscopy and mass spectrometry have relied extensively on inductively coupled plasmas (ICPs) for the last 30+ years. Although very successful and robust, ICP excitation/ionization sources are large, require specialized RF electronics, and use large quantities of support gas (argon) and cooling water during operation. Glow discharges are small, low-volume, and typically operated with simple DC power supplies. Examples of LS-APGD devices herein can be smaller, more compact and can provide multi-modal excitation/ionization sources in contrast with ICP sources, and can provide for miniaturization of spectroscopic instrumentation to meet the increasing need for field/remote analyzers.

Figure 1:
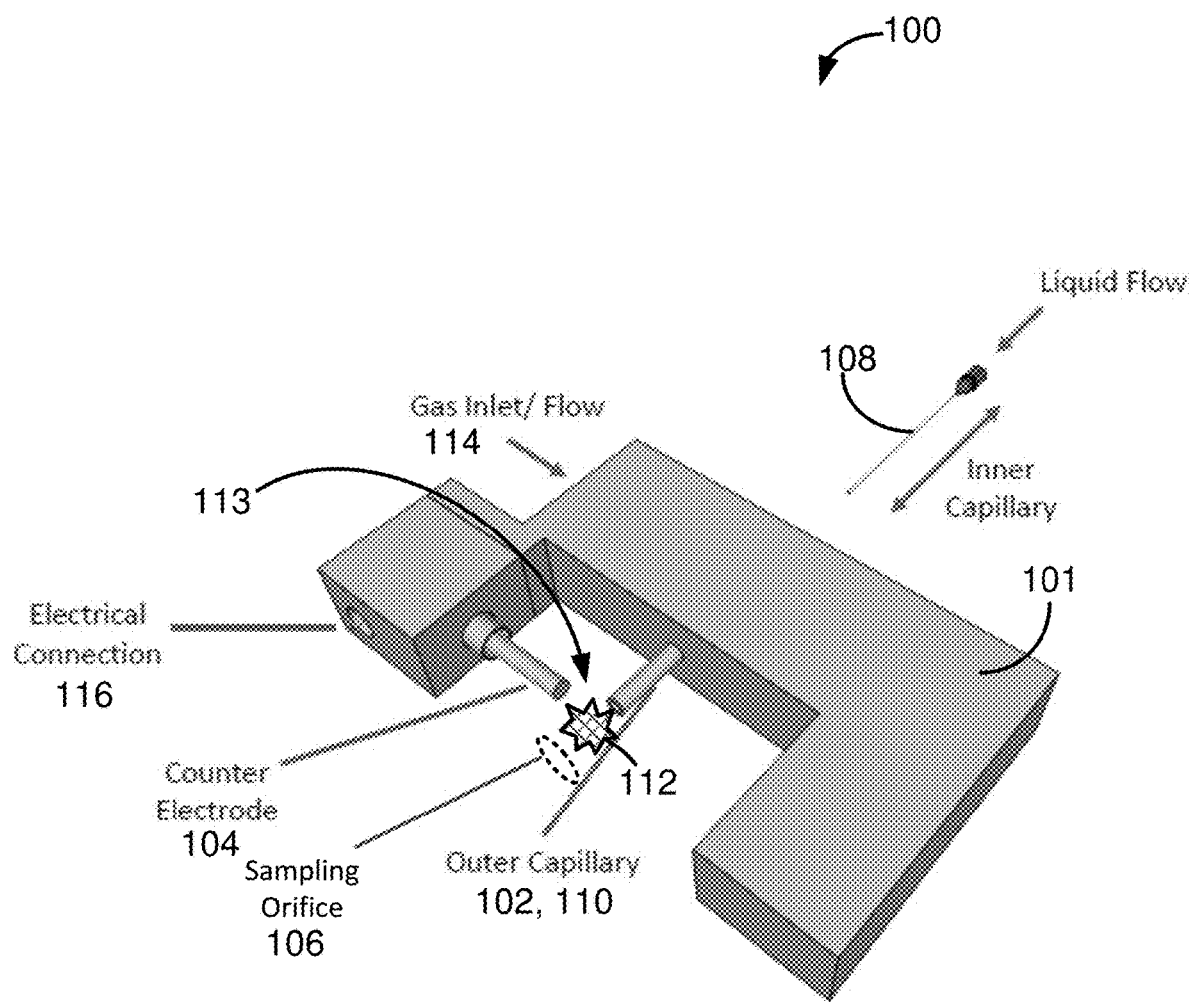
FIG. 1 is a perspective drawing of a single-electrode liquid sampling atmospheric pressure glow discharge (LS-APGD) device.

Different disclosed examples include single and multi-electrode atmospheric pressure glow discharge (APGD) ionization source designs and configurations for use in mass spectrometry. Examples expand on embodiments and principles disclosed in U.S. Pat. Nos. 6,852,969, 9,536,725, and 10,269,525, which are incorporated by reference herein to the extent not inconsistent with this disclosure. Existing APGD ion sources consist of two electrodes, with one having an electrolytic liquid and typically also containing a solution or sample to be analyzed, and the other (referred to as the counter electrode) having a metal body through which an electric potential can be applied and current can pass. Such systems are typically referred to as GD systems (which may also be capable of arcs and other non-GD reactions), and particular examples include liquid sampling-atmospheric pressure glow discharge (LS-APGD) systems. An example of a LS-APGD system that incorporates some of the features in the aforementioned patents is disclosed in FIG. 1. An LS-APGD device 100 includes an electrode holder body 101 which can be in the form of a block, cartridge, etc., or other support structure configured to hold electrodes, a liquid or solution electrode 102 that is held at ground potential, and a metallic counter electrode 104 that is configured to receive a positive potential. The solution electrode 102 is typically mounted in-line with an ion sampling orifice 106 (though other examples can have the solution electrode 102 mounted in other orientations), and the metallic counter electrode 104 is mounted perpendicular to that direction as shown (though other examples can have the counter electrode 104 mounted at other angles different from perpendicular). During operation, a solution flows from solution electrode 102, which can include an inner capillary 108 which carries the solution and can include an outer capillary 110. The plasma maintenance potential exists between the solution in the inner capillary 108 and the counter electrode 104. A plasma 112 is generated between the electrodes 102, 104 in a reaction volume 113 that is defined in part by a positioning of the electrodes 102, 104. The reaction volume 113 is positioned in proximity to the ion sampling orifice 106 (typically for a mass spectrometer instrument) so that ions from the plasma 112 are introduced to the mass spectrometer through the sampling orifice 106 via aerodynamic forces. For example, such aerodynamic forces can be produced by a directed flow of cooling sheath gas, introduced to the LS-APGD device 100 through a gas inlet 114 and outer capillary 110, and the vacuum existing within the instrument. The plasma 112 operating between the two electrodes 102, 104 is typically initially ignited by placing the electrodes 102, 104 in contact, applying a high voltage through electrical connection 116 to generate a current flow, and then retreating the electrodes 102, 104 away from each other to form the plasma 112. Some examples herein can provide alternative ignitions in fixed and/or spaced apart relationships.

Figure 2:
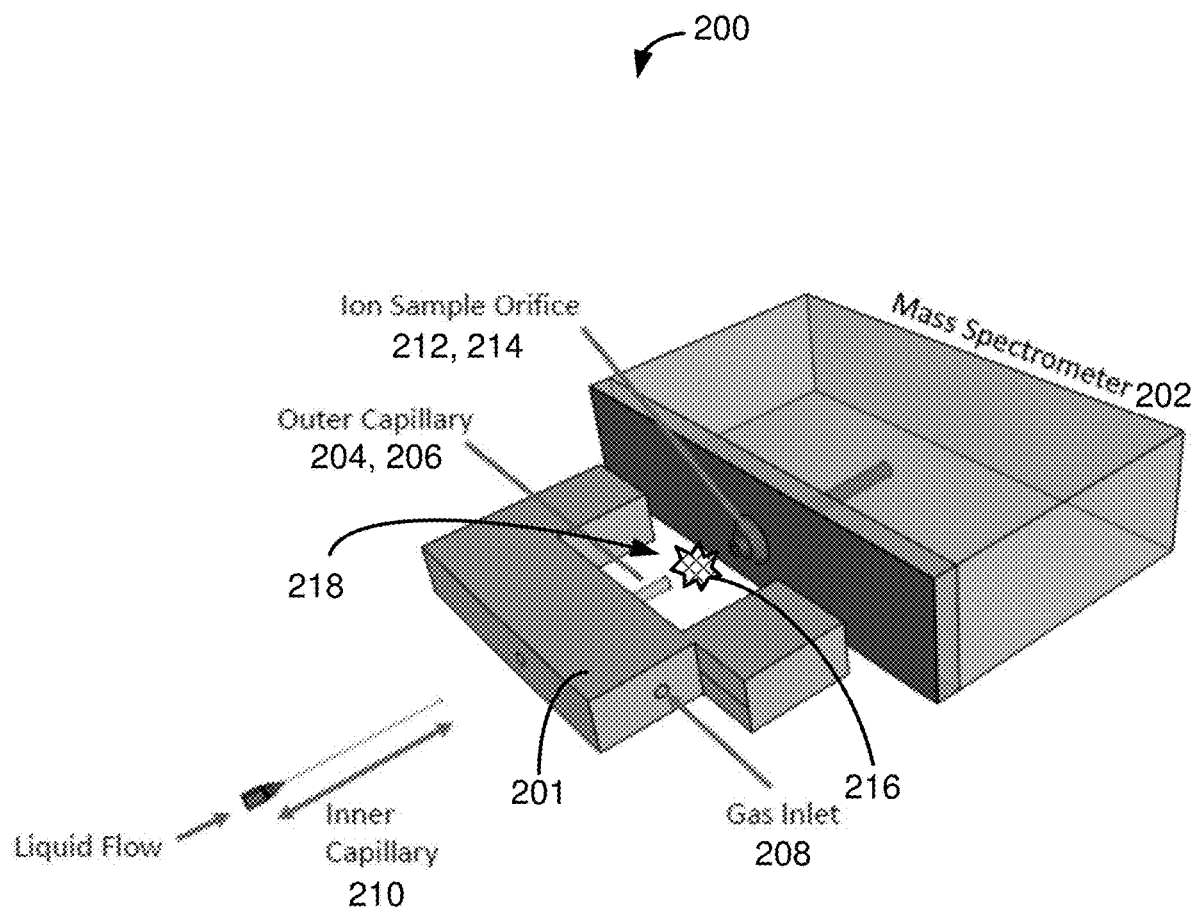
FIG. 2 is a perspective view of an example configuration of a single, integrated electrode LS-APGD device and analyzer device.

FIG. 2 is an example LS-APGD system 200 that can be used to generate and direct ions to an analytical instrument such as a mass spectrometer 202. A solution electrode 206 is mounted to an electrode holder body 201, and includes an outer capillary 204 that can be used to provide a sheath gas coupled through a gas inlet 208. An inner capillary 210 in the outer capillary 204 provides a liquid solution, typically containing an analyte to be analyzed. Additional examples can introduce analyte as a gas, and multiple capillaries spaced apart from each other may be used.

Analytes for this and other embodiments herein can include, environmental siderophores (Fe enriched microbial exo-metabolites), mercuro- and seleno-proteins, natural organic matter samples (marine, terrestrial, atmospheric organic matter samples), analytes requiring ultra-high resolution isobar separations to increase analytical confidence, and complex environmental, biological, and materials samples requiring both atomic and molecular characterization capabilities. Various examples can include analytes dissolved in a liquid solution (or a gas) that is flowed into an LS-APGD reaction volume such as a reaction volume 218 of the LS-APGD system 200. Analytes can also be separated in an injected electrolytic liquid, e.g., by propagating through a liquid chromatograph (HPLC) column before being discharged into a reaction volume, such as from the inner capillary 210. Analytes could also be separated through electrophoresis before injection into a reaction volume. Examples can include applying such an electrophoretic voltage proximate the reaction volume, such as at solution electrode corresponding to a discharge end of a capillary (such as solution electrode 206). Having the separation voltage being common with a solution electrode voltage can be convenient where an opposing counter electrode is at or near ground potential.

An ion sampling orifice 212 for the mass spectrometer 202 is arranged opposite the inner capillary 210 and outer capillary 204 (typically corresponding to the solution electrode 206) so that plasma ions that are generated are coupled into the ion sampling orifice 212. As shown, the LS-APGD system 200 further includes a counter electrode 214 that is "integrated" into the mass spectrometer 202 (or other device) in the form of the ion sampling orifice 212. Thus, in some examples, a distinct metallic counter electrode (such as the counter electrode 104 of the LS-APGD device 100) can be omitted by using the ion sampling orifice 212 of the mass spectrometer 202 (or other coupled device) as the counter electrode 214 of the LS-APGD system 200. Such examples can be referred to as integrated-electrode embodiments and can include specific examples referred to as single, integrated-electrode embodiments where an integrated single electrode is situated without additional electrodes being arranged at a common or similar potential. In some examples, the ion sampling orifice 212 can be an aperture or hole/bore in a plate, a cone with an aperture, or a capillary inlet. Thus, one or more surfaces proximate the aperture, such an edge or surface of the ion sampling orifice 212, can be in electrical communication with a power supply or ground, so as to operate as an electrode. In some examples, ion sampling orifice 212 can be part of another device, such as an ion guide. During operation, a plasma 216 is established in the reaction volume 218 between the electrodes 206, 214 by a potential difference existing between solution surface (of the solution electrode 206) and the counter electrode 214 at the ion sampling orifice 212. In some examples, the discharge sustaining voltage is applied to the electrolytic solution, flowing through and out the inner capillary 210 (either corresponding or not corresponding to an electrophoresis voltage), which can allow the counter electrode 214 to be maintained at or near a ground potential so as to meet or simplify operational requirements of the coupled mass spectrometer 202. Representative examples can avoid geometric and positioning limitations, such as complexities related to proximity of electrodes and proximity of microplasma to the ion sampling orifice 212. As such, design and operation of the ionization source and the coincident ion sampling for the mass spectrometer 202 are both simplified, and the operational time and costs can be reduced. Some examples can be configured and controlled using only one spatial sampling parameter corresponding to the distance between the solution electrode 206 and the ion sampling orifice 212. In further examples, electrodes in addition to the electrodes 206, 214 can be provided, including in any other example electrode configuration described herein.

Figure 4:
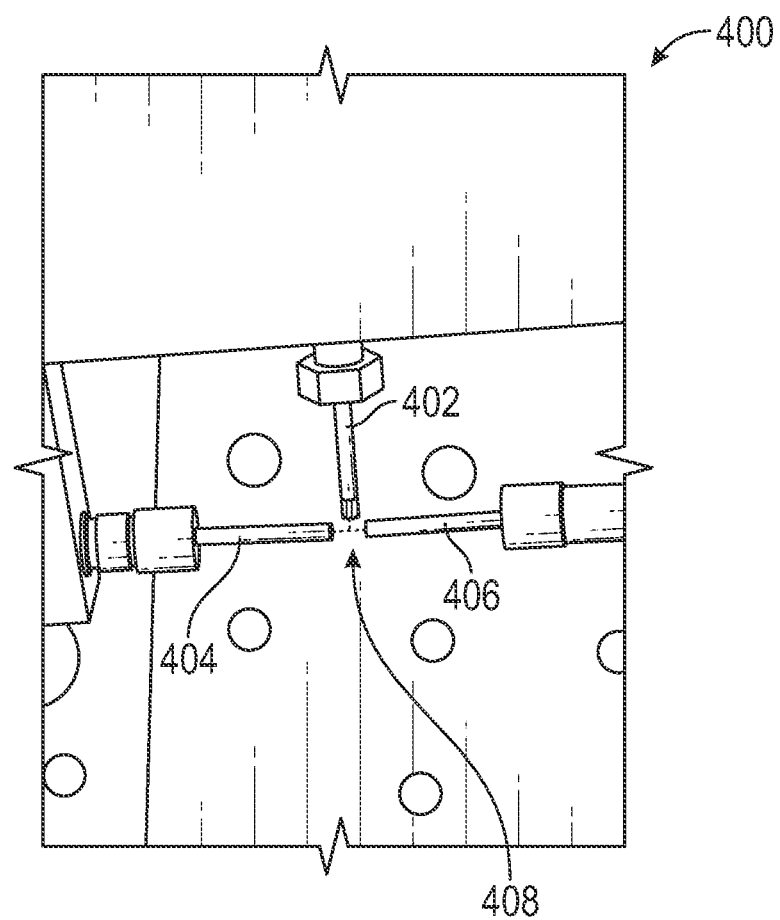
FIGS. 4-5 are photographs of a dual-electrode LS-APGD showing a combined, more powerful discharge.
Figure 5:
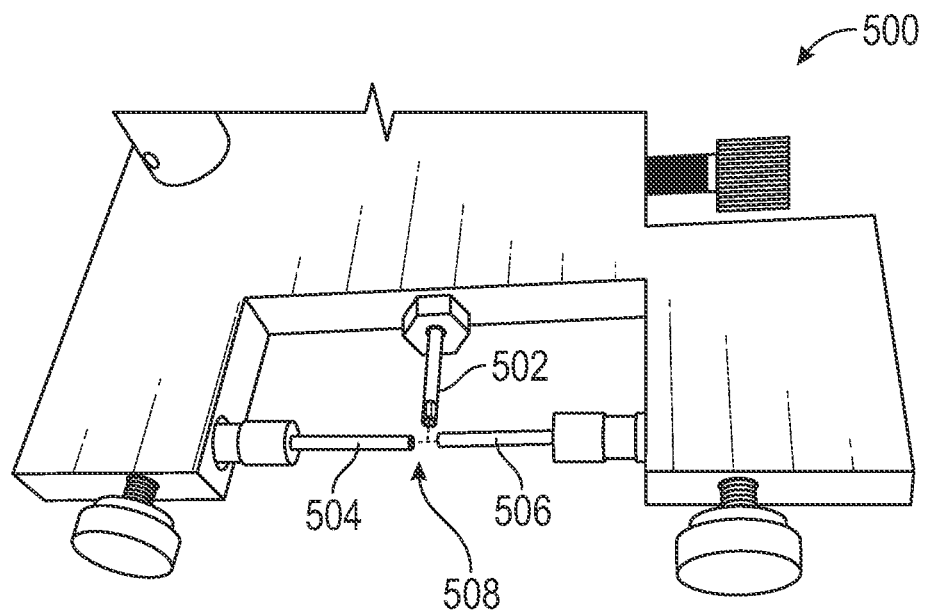

FIGS. 3A-3C shows an example LS-APGD device 300 that can also be used to generate and couple ions to an analytical instrument, such as a mass spectrometer, through an ion sampling orifice 302. A solution electrode 306 is mounted to an electrode holder body 301, and includes an outer capillary 304 that can be used to provide a sheath gas coupled through a gas inlet 308. An inner capillary 310 in the outer capillary 304 provides a liquid solution, typically containing an analyte to be analyzed by the mass spectrometer. The ion sampling orifice 302, through which the ions enter, is arranged opposite the inner capillary 310 and outer capillary 304 so that ions that are formed in the plasma 311, which is generated in a reaction volume 313, are coupled into the ion sampling orifice 302. As shown, the ion sampling orifice 302 is arranged in-line along a common axis 312 with the inner capillary 310 or outer capillary 304, and can correspond to a solution flow axis. The LS-APGD device 300 also includes first and second counter electrodes 314, 316 mounted to the electrode holder body 301 and arranged collinearly with each other along a counter electrode axis 318, perpendicular to and intersecting the common axis 312. The counter electrodes 314, 316 can be arranged in non-perpendicular, non-intersecting, and/or non-collinear arrangements in further examples. The plasma 311 is formed by an electrical potential difference between the solution electrode 306 and the metallic counter electrodes 314, 316 typically held at a common electrical potential (though dissimilar potentials are possible). In the electrode arrangement of the LS-APGD device 300, the plasma 311 can operate at total discharge currents that are twice (or larger) the discharge currents normally applied to the electrode arrangement shown in the LS-APGD device 100, in this case two counter electrodes can each carry equivalent (or different) currents. This higher current density can provide improved results without degradation normally associated with the additional current passed through a single counter electrode as in the LS-APGD device 100. During operation of some examples, an aerosolized solution species can pass between the two counter electrodes 314, 316, resulting in greater degrees of analyte ionization along with lower amounts of ions having solvent adducts ($M+H_2O$, $+OH$, etc.) or other polyatomic interferent ions ($M_2^+$, $MO^+$, $MH^+$, etc.). Consequently, more sensitive analyte responses are observed, with simpler spectral composition, as compared to response outputs for other LS-APGD devices, such as the LS-APGD device 100. The arrangement of electrodes 314, 316 can also produce a physically larger plasma during operation, providing for a more precise, optimized, and efficient sampling positioning with lower levels of extraneous and undesired atmospheric ions being sampled. It will be appreciated that variations can be made to the orientation and positioning of the different electrodes. For example, the common axis 312 can be two parallel axes or non-parallel axes, and can intersect or not intersect. The counter electrode axis 318 can also be instead two parallel or non-parallel axes, can intersect or not intersect each other or the common axis 312 (or one or more of the parallel or non-parallel axes replacing the common axis 312). In examples where the counter electrode axis 318 is two non-parallel axes, the non-parallel axes can be symmetrically arranged to intersect the common axis 312, e.g., at symmetric angles different from 90 degrees, such as 85, 70, 60, 45, etc. Asymmetric angles are also possible. FIGS. 4 and 5 show images of LS-APGD arrangements 400, 500 having respective solution electrodes 402, 502 and transversely arranged opposing counter electrodes 404, 406, 504, 506 generating electrical discharges 408, 508.

As shown, a liquid analyte flows into the reaction volume 313 through a discharge end of the inner capillary 310. In further examples, the analyte can be separated from an electrolyte into different channels. For example, an aerosolized (or gasified) analyte sample can flow through a capillary, such as the inner capillary 310, the outer capillary 304, a sole capillary, or capillary interior of one or both of the counter electrodes 314, 316, and a liquid electrolyte solution can flow separately out an adjacent capillary, such as the other of the inner or outer capillaries 310, 304, a capillary spaced apart from the aerosolized analyte capillary, or a capillary interior of one of the counter electrodes 314, 316. Analytes can be carried through counter electrodes, such as counter electrodes 314, 316, including secondary gas samples or carrier gases carrying samples. Capillaries flowing a liquid solution will typically include a sheath gas flowing through a surrounding capillary, but such a surrounding flow is not required. Examples of the LS-APGD devices 100, 200, etc., described herein can include a separation of analyte and electrolyte as well according to any configuration described herein, including by replacing rod counter electrodes with electrodes having a hollow, capillary interior suitable for flowing gas or liquid, by way of example. In some of such examples, the solution electrode 306 can be situated at the discharge end of the inner capillary 310 which can be situated without a surrounding outer capillary. In examples flowing a sheath gas (including in an outer capillary surrounding an inner capillary), analyte can be coupled to the sheath gas before flowing together with the sheath gas into the LS-AGPD reaction volume. Suitable ways to obtain an aerosolized or vaporized analyte that can be coupled into the reaction volume 313 can include laser sources configured to ablate material, such as diode-pumped pulsed laser sources. Pulse durations can range from nanosecond to femtosecond. In some examples, changes to laser parameters (pulse duration, pulse energy, repetition rate, peak power, etc.) or other aerosolizer parameters (gas flow rate, temperature, propellant, pressure, nozzle geometry, etc.) can be used to adjust aerosol characteristics (particle size, type, chirality, etc.) and associated ion species generated in the reaction volume 313. Other ways to generate an aerosol include analytical nebulizers, such as induction or non-induction nebulizers, pneumatic, ultrasonic, or impact nebulizers, electrothermal vapor and/or particulate aerosolizers, etc. Powder-form samples can also be physically dispersed in to a flowing gas stream and transported to volume 313. In arrangements with multiple electrodes, more than one counter electrode can be configured to flow a gas or liquid, including sheath gas, analyte in a gas, liquid or solid state, electrolyte solution, or a gas phase internal standard (IS). The flow axis 312 can be bent, curved, or include multiple branches, to accommodate separation of analyte and electrolyte or varied positioning of sheath gas inputs to the reaction volume 313. In some examples, the LS-APGD device 300 can operate in non LS-APGD regimes. For example, described electrode and analyte introduction arrangements (including but not limited to the LS-APGD device 300) can be used as an excitation source configured to excite a sample rather than to ionize or produce a glow discharge, such as in optical emission spectroscopy or other similar applications. Further examples can be configured to both excite samples for optical emission spectroscopy in a first optical emission mode (such as by providing a lower current through the volume or with fewer or more counter electrodes being powered, or being powered in a different sequence) and to ionize samples in a second GD mode. By having more than one counter electrode, the LS-APGD device 300 (as well as other multi counter electrode examples) can exhibit improved washout characteristics, including faster washout time and reduced carryover between LS-APGD cycles. A washout time generally refers to the length of time after an analyte has ceased to flow into the APGD volume to remove lingering residual analyte species and fragments to prevent noise or false positives in a subsequent APGD test. The larger and hotter plasma provides improved vaporization of the analyte and leads to a more thorough self-cleaning of the APGD volume and surrounding surfaces, such as the inlet to the mass spectrometer.

Figure 6:
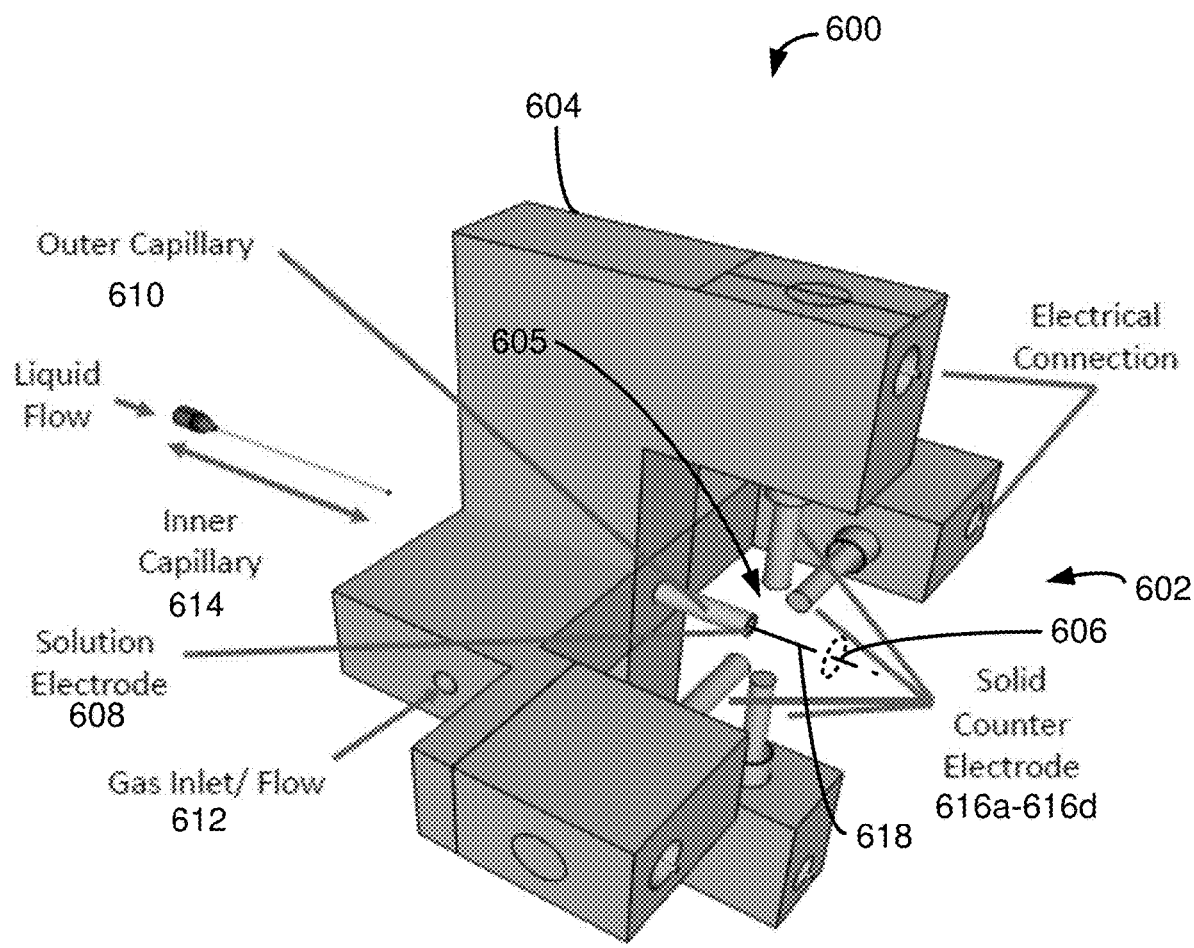
FIG. 6 is a perspective view of another new LS-APGD design, this one a quadruple-electrode embodiment with even higher power and flexibility (allowing multiple sample or standard entry options with the additional electrodes).

FIG. 6 is an example LS-APGD device 600 that includes multi-electrode arrangement 602 coupled to an electrode holder body 604 and configured to produce a plasma in a volume 605. An ion inlet orifice 606 can be arranged adjacently to the multi-electrode arrangement 602 to couple ions out of the volume and into an analytical instrument such as a mass spectrometer. It will be appreciated that various devices, including ion guides, funnels, other transfer devices, traps, drift tubes, extensions, frames, supports, etc., may be coupled between the volume 605 and the mass spectrometer, and can be part of the mass spectrometer, part of the LS-APGD device 600, or can be separate devices. Further examples can also direct the ions through the ion inlet orifice 606 to instruments or applications other than mass spectrometers or mass spectrometry. The ion inlet orifice 606 can be part of the electrode holder body 604 or part of the analytical instrument. The electrode arrangement 602 includes a solution electrode 608 including an outer capillary 610 and an inner capillary 614 that can be nested in the outer capillary 610. The outer capillary 610 can transmit a sheath gas, via a gas inlet 612, into the volume 605 to assist with coupling the plasma-generated ions into the ion inlet orifice 606. An inner capillary 614 can be disposed in the outer capillary 610 (e.g., concentrically), and can be configured to direct an analyte liquid solution into the volume 605. The multi-electrode arrangement 602 further includes four counter electrodes 616a-616d having discharge ends directed into the volume 605 in a predetermined angled relationship with the counter electrodes 616a-616d arranged in a common plane to be perpendicular to adjacent counter electrodes and collinear with opposing counter electrodes, and with the counter electrodes 616a-616d being perpendicular to an axis 618 of the solution electrode 608 and intersecting the axis 618. It will be appreciated that other angles, spacing relationships, and numbers of electrodes are possible. For example, the counter electrodes 616a-616d can be arranged to define two or more planes or non-planar surfaces. Electrodes can be non-perpendicular and/or non-collinear as well. In some examples, multiple defined planes can be parallel to each other, and in further examples the planes can be perpendicular to the axis 618. As with other multiple counter electrode examples, the LS-APGD device 600 can be operated multi-modal. For example, the counter electrode 616a can be powered to produce a plasma, then an adjacent electrode, such as counter electrode 616b, 616c, 616d can be powered at a selected time after the counter electrode 616a is powered, followed by powering an additional one of the counter electrodes 616b-616d that is unpowered, followed by powering the remaining one of the counter electrodes 616b-616d. In further examples, multiple ones, or all, of the counter electrodes 616a-616d can be powered simultaneously. Various sequences of successive and/or simultaneous ignition can be provided, depending on the particular analytical application. For example, a specific analysis can use a single counter electrode while other analyses may use a plurality.

Figure 7A:
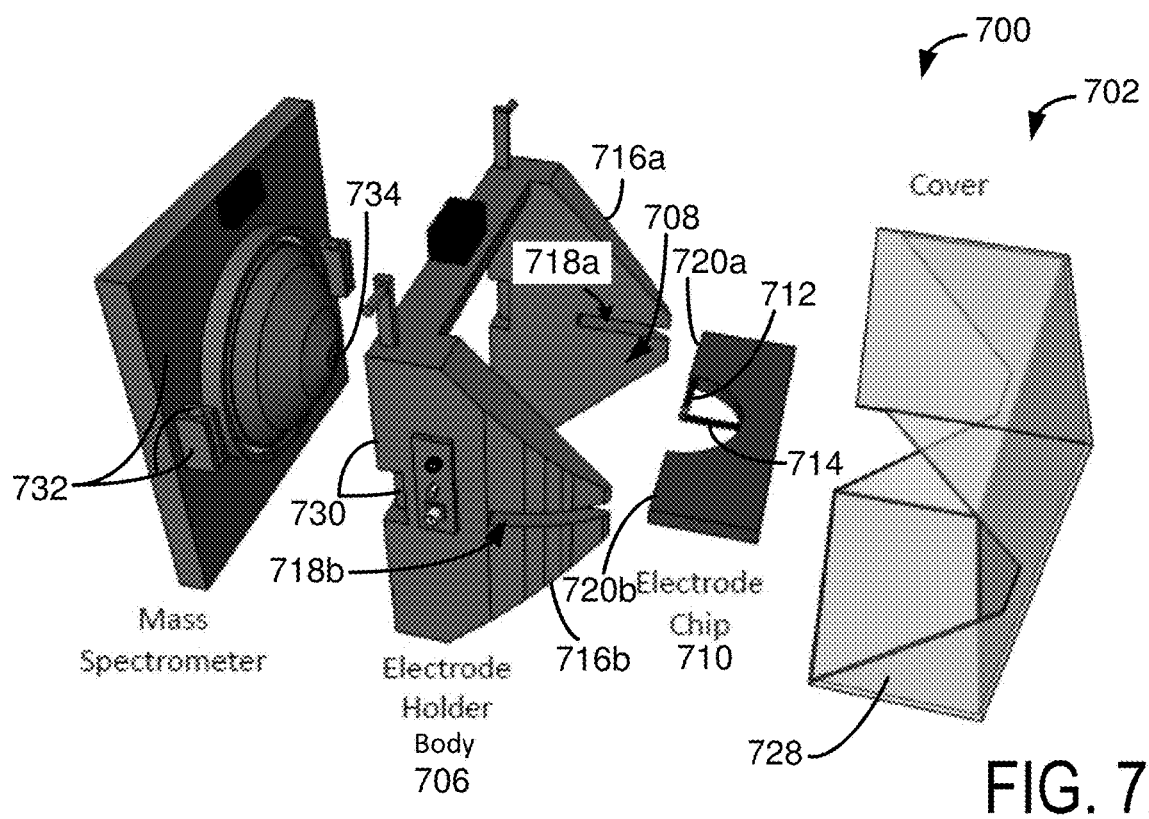
FIG. 7A-7B are exploded-perspective and perspective views, respectively, of a unique holder device, with cover, for the above LS-APGD designs. This allows consistent yet adjustable and optimal plasma positioning.
Figure 7B:
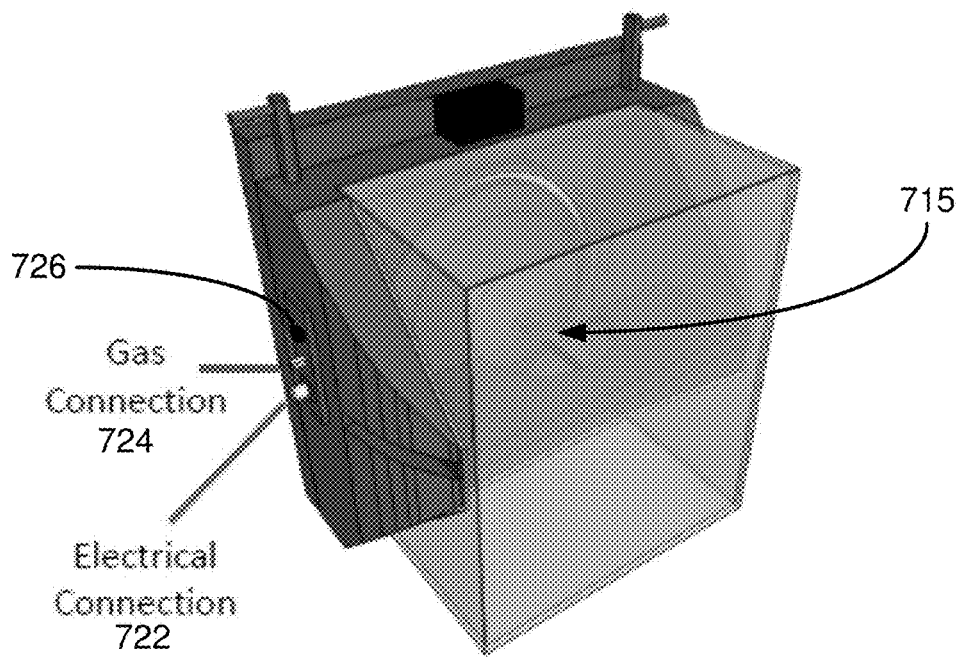

FIGS. 7A-7B show an example of an integrated holder 700 that can be used to interface an LS-APGD ion source 702 to a mass spectrometer 704 or other analytical instrument or device configured to receive ions. The integrated holder 700 can be used for improved reproducibility of ion source characteristics while allowing for convenience of operation, facilitation of routine maintenance, and improved safety for a user. The integrated holder 700 includes an electrode holder body 706, such as a bracket, that includes a receiver 708 shaped to receive an electrode chip 710 in a predetermined position. In some examples, the electrode chip 710 can be in the form of a block or cartridge. The electrode chip 710 includes one or more electrodes 712, 714 that can be used to conduct current to produce a plasma in a plasma discharge volume 715 during operation of the LS-APGD ion source 702. In some examples, the electrode holder body 706 includes two extension members 716a, 716b having respective slots 718a, 718b configured to receive opposing ends 720a, 720b of the electrode chip 708. The electrode holder body 706 can include one or more electrical connection ports 722, a gas connection 724, and a liquid solution port 726. With the electrode chip 710 secured in the receiver 708 in the predetermined position with respect to the electrode holder body 706, electricity can coupled to one or more of the electrodes 712, 714 through the electrical connection port 722 and one or both of the opposing ends 720a, 720b, and gas can be coupled to the plasma discharge volume 715 proximate the ends of the electrodes 712, 714 (such as through an outer capillary of the electrode 714, which can correspond to a solution electrode) through the gas connection 724 and one or both of the opposing ends 720a, 720b. In some examples, a liquid solution such as one containing an analyte to be analyzed can be coupled to the plasma discharge volume 715 proximate the ends of the electrodes 712, 714 through an inner capillary of the electrode 714 (as solution electrode), via the liquid solution port 726 and one or both of the opposing ends 720a, 720b. A cover 728 can be shaped to form a protective shroud around the plasma discharge volume 715 to protect a user or instruments. In some examples, the cover 728 can form an air-tight and/or water-tight seal. In further examples, the cover 728 can be transparent or be configured with a predetermined opacity. The presence of the cover 728, even if not forming an air-tight seal, can improve the stable operation of the plasma as cross-flows associated with localized air currents or small pressure perturbations (e.g., associated with HVAC cycling, window or insulation induced temperature gradients, ingress/egress activity, etc.) can disrupt sheath boundary flows and cause atmospheric species to penetrate active plasmas. Associated improvements to signal-to-noise ratio can also be observed with the presence of the cover 728. The electrode holder body 706 can further include one or more surfaces 730 that can be shaped in relation to the position of the electrodes 712, 714 with the electrode chip 710 secured in relation to the electrode holder body 706 and one or more surfaces 732 of the mass spectrometer 704 so that the surfaces 730, 732 may contact each other and the plasma discharge volume 715 and the flow from the inner capillary can be aligned with an ion inlet 734 of the mass spectrometer. In some examples, the surfaces 732 can be part of securing or fastening mechanisms, and can include bendable ribs defining slots with a wider slot end. The contact surfaces 730 can include a wider end portion shaped to correspond to the wider slot end so that the bendable ribs can flexibly bend to allow insertion and securing of the wider end portion. Screws, clamps, and other fasteners can be used as well. In some examples, the surfaces 732 can be retrofitted to mate with an existing mass spectrometer 704, such as by using the same or similar fittings and attachment mechanisms used to couple an existing ion source (e.g., an ESI source or a MALDI source) to the mass spectrometer 704, and thereby provide ion source interchangeability. The electrode chip 710 can be conveniently removed and replaced with a new or alternative electrode chip, for example, after a given number of hours of use, if inspection reveals electrode degradation or failure, if an alternative electrode arrangement is desired for a particular application, etc.

Experimental Results

Source Design

Experiments were conducted comparing the performance of examples of the LS-APGD device 100 and the LS-APGD device 300, including by varying the number of potentials that are applied to generate the plasma with the LS-APGD device 300. For the LS-APGD device 300, the solution electrode 306 was held at ground potential and placed between the two counter electrodes 314, 316 (formed of nickel) that received a high voltage potential (10-40 mA; 100-1000 V d.c.). Two power supplies (Ultravolt 1C24-P60-I5, Ronkonkoma, N.Y.) were coupled to the counter electrodes 314, 316 and were operated in constant current mode. The outer capillary 304, 110 of the solution electrode 306, 102 was a stainless steel capillary (I.D. 1 mm, O.D. 6.35 mm), configured to deliver a cooling He sheath gas. The inner capillary 310, 108 was a nested inner fused silica capillary (I.D. 250 um, O.D. 350 um, Molex, Ill.), that delivered the solution to the reaction volume 313, 113 where the plasma 311, 112 is generated. A flow rate of the solution was controlled using a syringe pump (Chemyx OEM 30020, Stafford, Tex.), and the gas was delivered via a mass flow controller (Alicat BC-C1000-He-232-NPT, Tucson, Ariz.). The plasma 311, 112 was auto ignited by placing a high potential on the counter electrodes without bringing the solution electrode in contact with either of the counter electrodes 314, 316, 104 (discussed further herein below). In the experiments, a single maintenance voltage power supply, ignition source, mass flow controller and syringe pump were housed and in a control/utility box. A second control box was used to control the power applied to the second counter electrode 316. In additional examples, a single control box may be used to control multiple electrodes. The self-contained unit was comprised of a 10×5×9" polycarbonate shell, and controlled using a computing unit including a processor, memory, and resistive touchscreen display.

Mass Spectrometer System

The experiments were carried out using a ThermoScientific Q Exactive Focus mass spectrometer (MS) which uses an Orbitrap mass analyzer. The plasma was interfaced with the MS by removing the commercial ESI source and source housing and attaching the plasma source. For the LS-APGD device 300, the solution electrode was mounted in-line with the sampling orifice of the MS and the counter electrodes were mounted collinearly with each other, but perpendicular to the solution flow axis. There was no modification, including changes to ion optic potentials or capillary temperatures, made to the Q Exactive Focus. The Q Exactive Focus was operated in a positive ion mode. As in previous experiments, collision induced dissociation was used in order to limit the number of interfering molecular species. For the experiments a collision induced dissociation (CID) of 75 eV and a higher energy collision induced dissociation (HCD) of 100 eV were used to limit the number of interfering ions present in the spectrum.

For the experiments, two multi-element solutions were used. The first solution contained 500 ng mL$^{-1}$ of Rb, Ag, Ba, Tl, and U each. The U sample used in the experiments was donated by high purity standards and is traceable to a certified reference material. A second solution made up of 1-10,0000 ng mL$^{-1}$ of Cu, Cs, and Pb was also prepared to generate response curves.

Plasma Operation

Figure 8:
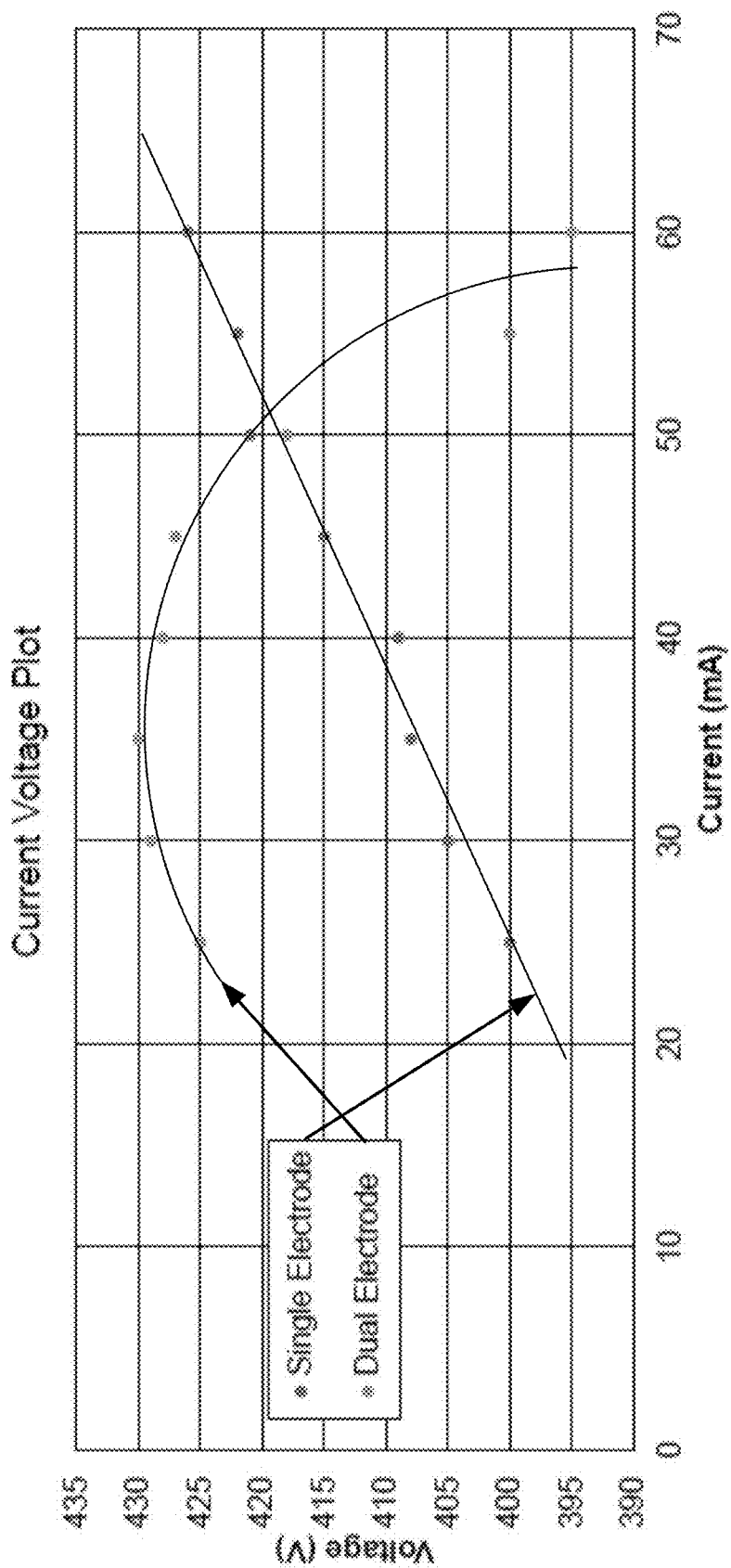
FIG. 8 is a current-voltage profiles for single electrode and dual electrode embodiments.

The operating regime of current and voltage and i-V relationships is generally well defined for glow discharge sources, as demonstrated in Marcus et al., "An Atmospheric Pressure Glow Discharge Optical Emission Source for the Direct Sampling of Liquid Media" Anal. Chem. 2001, 73, 2903-2910 (incorporated herein by reference to the extent not inconsistent with this disclosure), which originally describes using the ion sources for optical emission spectroscopy. FIG. 8 shows current-voltage plots comparing the operating regime of the LS-APGD device 300 and the LS-APGD device 100. As can be seen from the figure, when using the LS-APGD device 100, there is a positive slope corresponding to the abnormal glow discharge regime. A somewhat different response is observed with operation of the LS-APGD device 300 (showing the current through one of two counter electrodes, with the other of the two counter electrodes also having the same current, resulting in twice the current through the volume during operation). While there is an initial increase in voltage, at higher current settings, >35 mA, the current voltage relationship is negative, which may be attributed to an increase in the volume of the plasma, which is also noticeable through visual inspection of the reaction volume 313. Because the relationship between i-V is only true for a given volume, the changing volume can make a direct comparison difficult, though a more thorough comparison can be made with additional experiments/results.

Figure 9A:
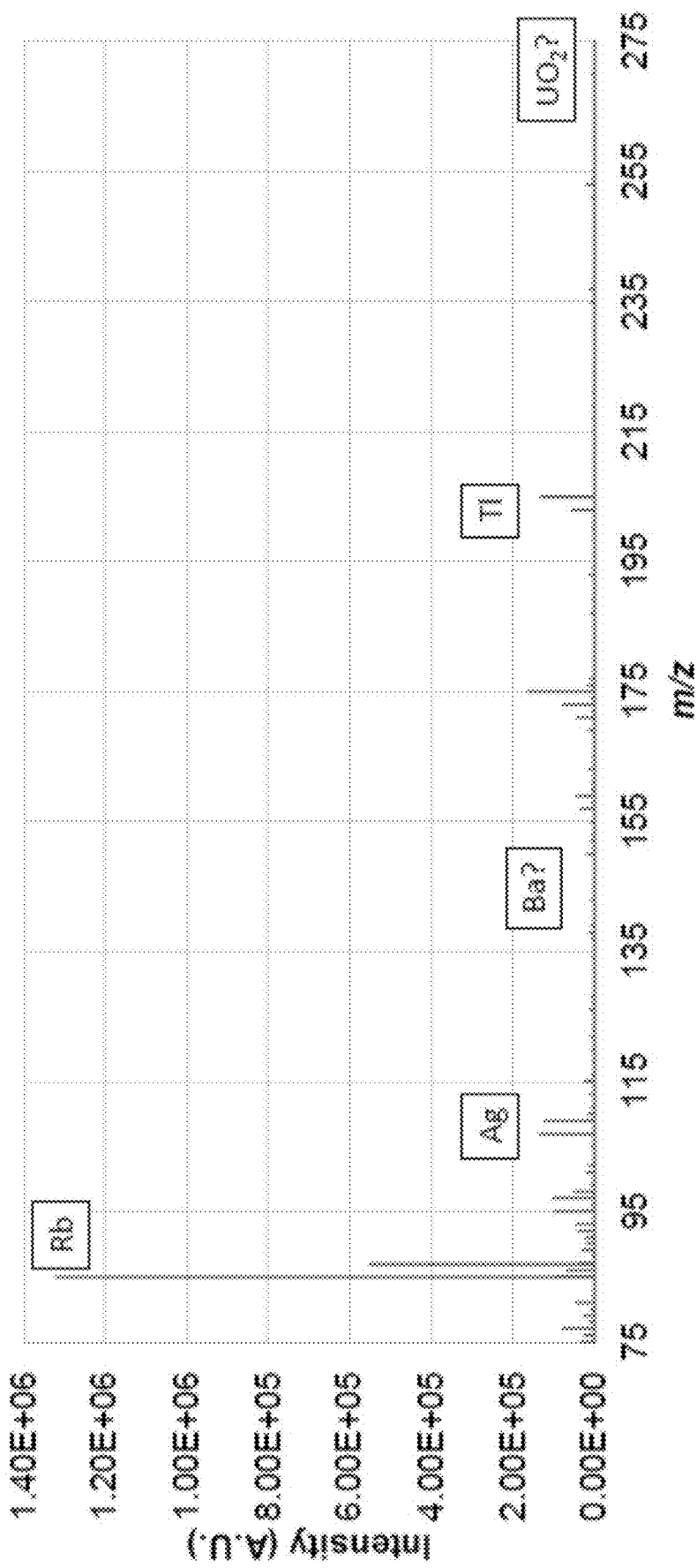
FIGS. 9A-9D are graphs of mass analysis results comparing single- and dual-electrode LS-APGD devices. FIGS.
Figure 9B:
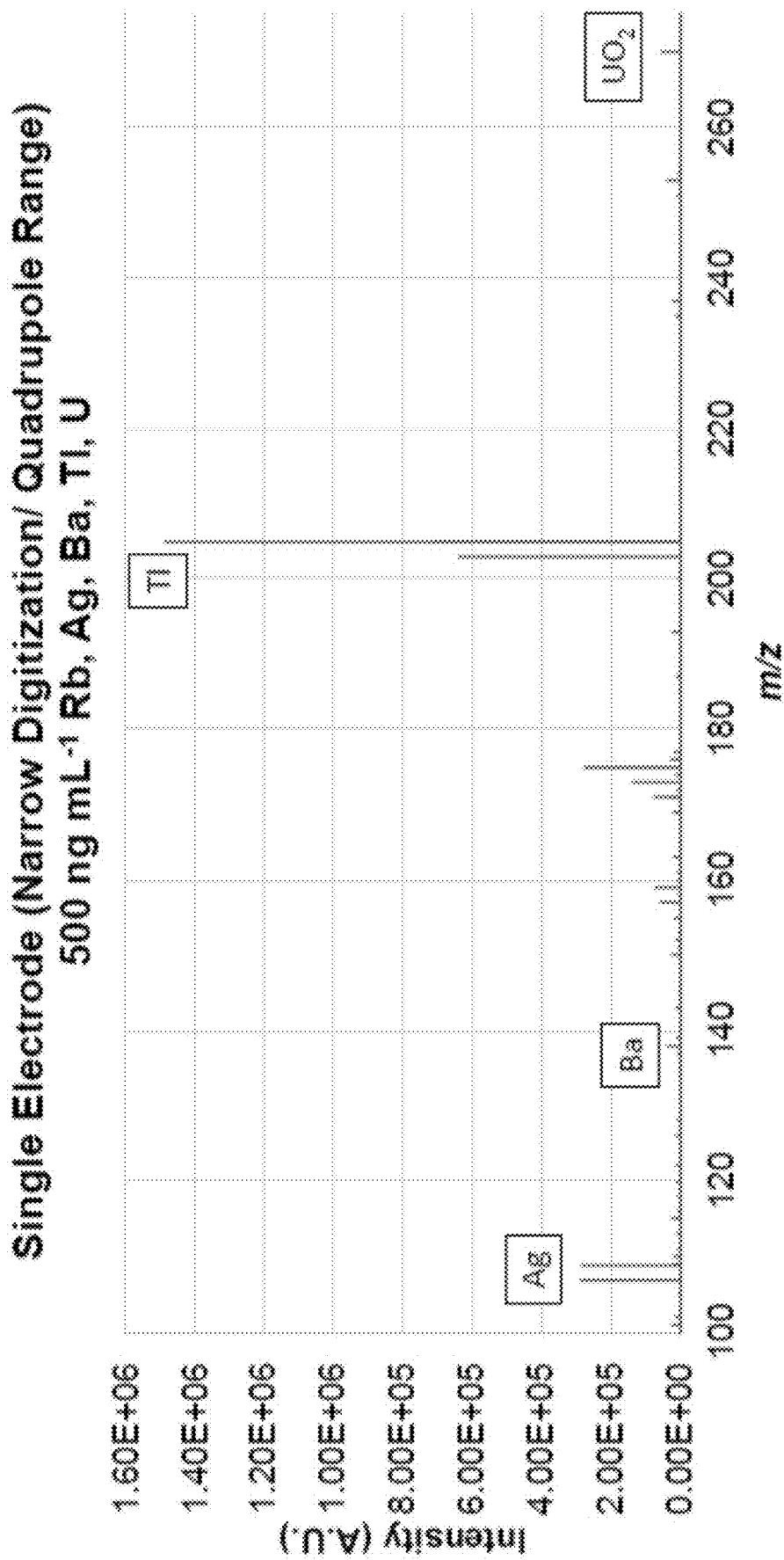
Figure 9C:
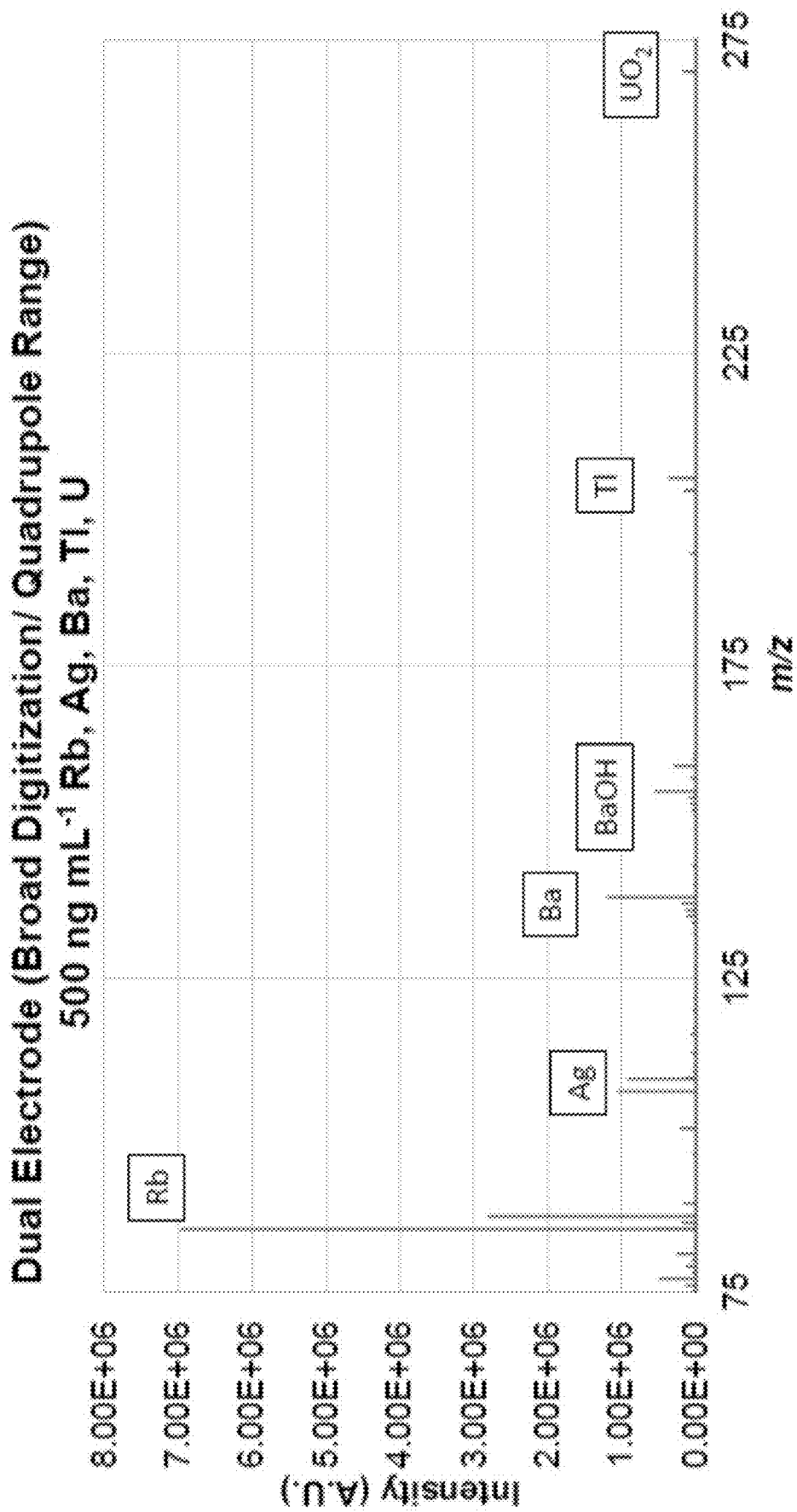
Figure 9D:
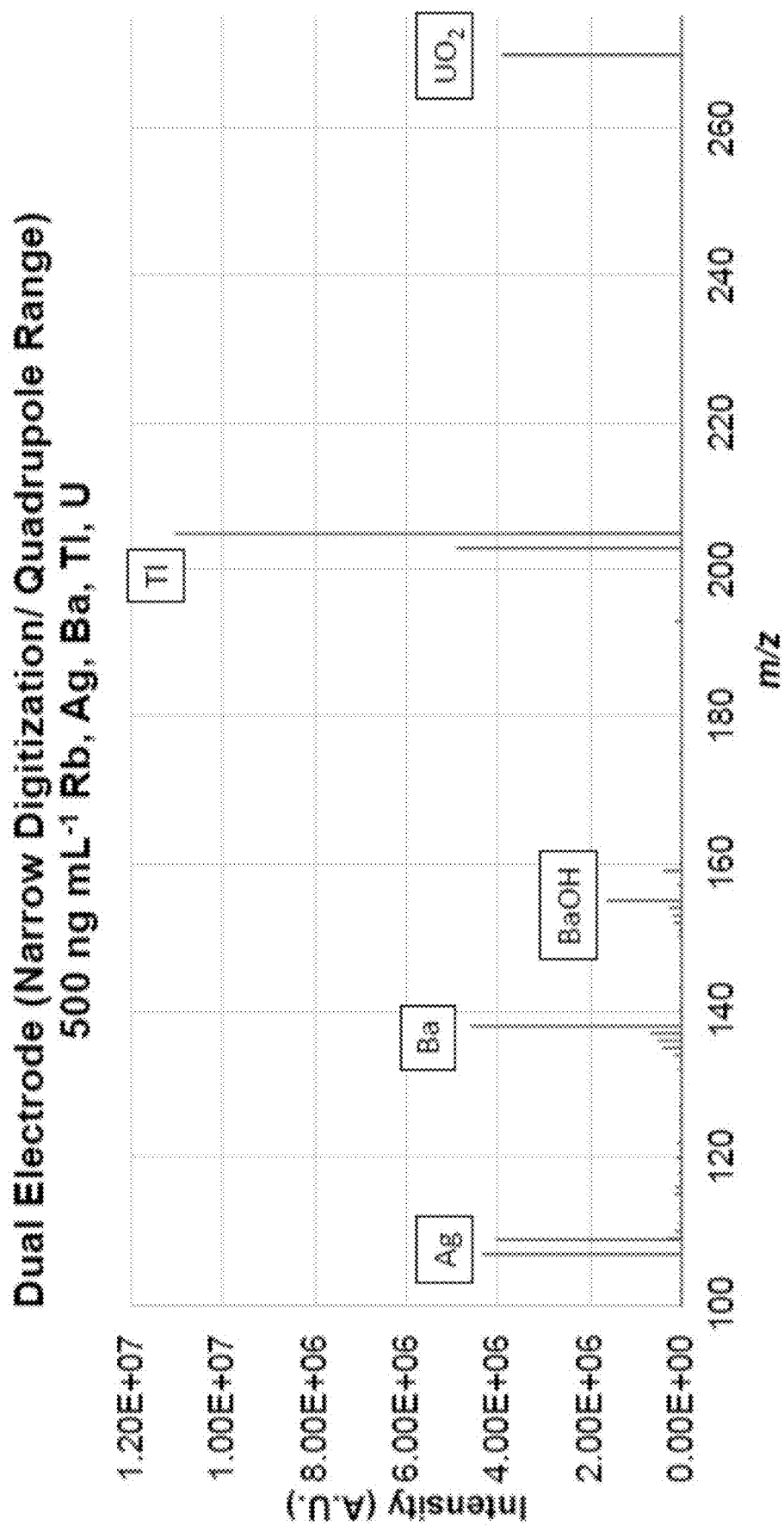

In order to demonstrate the efficacy of using additional electrodes to operate the LS-APGD the multi-element test solution containing 500 ng mL$^{-1}$ of Rb, Ag, Ba, Tl and U was analyzed. FIGS. 9A-9D shows spectra taken using the LS-APGD device 100 (FIGS. 9A & 9B) and the LS-APGD device 300 (FIGS. 9C & 9D). In both cases the Rb is the prominent ion which is partially due to how the Thermo system operates the quadrupole, as can be seen in FIGS. 9A & 9C. Regardless, a 5× increase in response was observed when using the LS-APGD device 300. Also, there is a significant decrease in the observed molecular background peaks in the spectra when using LS-APGD device 300 or other similar LS-APGD devices herein. Due to space charge limits of the Orbitrap, which is independent of the LS-APGD device, using a smaller quadrupole and digitization range to selectively fill the trap, excluding Rb from entering the Orbitrap, reveals a similar increase for the other ions of interest, ranging from a 2× improvement for Ag, to over a 150× increase for Ba, for the LS-APGD device 300, as shown in FIGS. 9B & 9D. However, it is remarkable that the intensity of ion signals is similar across the spectrum when using the LS-APGD device 300.

Limits of Detection

In order to quantify the difference in sensitivity between the LS-APGD devices 100, 300, response curves for selected ions were produced. For this set of experiments, a multi-element solution containing Cu, Cs, and Pb was prepared and diluted, with final concentrations representing response curves that cover five orders of magnitude. In each case a narrow quadrupole range (50 Da wide) and digitization range (10 Da wide) were used in order to limit space charge effects. Also, for the case of Cu and Pb, where multiple isotopes were simultaneous measured, only the minor isotopes, $^{65}$Cu and $^{204}$Pb, were plotted. FIGS. 10-12 show the response curves for each element/isotope, where each data point represents three injections of 100 μL each. For most cases, the error bars are smaller than the data point itself. In addition to comparing the LS-APGD device 100 operating at 30 mA (as optimized by Hoegg et al., "Preliminary Figures of Merit for Isotope Ratio Measurements: The Liquid Sampling-Atmospheric Pressure Glow Discharge Microplasma Ionization Source Coupled to an Orbitrap Mass Analyzer" J. Am. Soc. Mass. Spectrom. 27:1393-1403 (2016) (incorporated herein by reference to the extent not inconsistent with this disclosure)) and the LS-APGD device 300, where each counter electrode has a 30 mA current passing through it (a total of 60 mA), a third scenario was tested where the LS-APGD device 100 was operated at 60 mA. This comparison was made to verify that increased response was not only obtained by simply increasing current. As can be seen from FIGS. 10-12, there is an improvement in both sensitivity and response for each of the elements investigated when using the LS-APGD device 300. In the case of Cu and Pb, there is an order of magnitude improvement for both. In the case of Cs, for the LS-APGD device 100 at both currents tested, the data point that represents the highest concentration, 10,000 ng mL$^{-1}$, departs the linear response, which is a response not seen in either of the other elements. Because a similar response is not seen when using the LS-APGD device 300, it is unlikely that it is the mass spectrometer that is the limiting factor. Thus, the capacity for ionization with the LS-APGD device 300 appears to be greater than that of the LS-APGD device 100. Based on the response curves, limits of detection were calculated for each element, as shown in Table 1.

TABLE 1

| Electrode Configuration | Element (Isotope) | Y = mX + b | R$^2$ | LOD (ng mL$^{-1}$) | pg |
|---|---|---|---|---|---|
| Dual Electrode (60 mA) | $^{65}$Cu | Y = 104279X − 1E6 | 0.9988 | 0.00068 | 0.07 |
| Single Electrode (60 mA) | | Y = 6697.4X − 42088 | 0.9999 | 0.02249 | 2.25 |
| Single Electrode (30 mA) | | Y = 258.44X − 35325 | 0.9777 | 0.09864 | 9.86 |
| Dual Electrode (60 mA) | Cs | Y = 7780.8X − 2E6 | 0.995 | 0.00217 | 0.22 |
| Single Electrode (60 mA) | | Y = 5911X − 61581 | 0.9989 | 0.01062 | 1.06 |

TABLE 1-continued

| Electrode Configuration | Element (Isotope) | Y = mX + b | $R^2$ | LOD (ng mL$^{-1}$) | pg |
|---|---|---|---|---|---|
| Single Electrode (30 mA) | | Y = 2261.9X − 43766 | 0.9984 | 0.01443 | 1.44 |
| Dual Electrode (60 mA) | $^{204}$Pb | Y = 32954X − 40442 | 0.9992 | 0.00068 | 0.07 |
| Single Electrode (60 mA) | | Y = 1321.4X − 2194.9 | 0.9985 | 0.00563 | 0.56 |
| Single Electrode (30 mA) | | Y = 571.42X − 343.89 | 0.9997 | 0.01180 | 1.18 |

LODs were calculated using the equation:

$$LOD = \frac{3\sigma}{m}$$

where σ is the standard deviation of the lowest concentration, m is the slope of the line, and a multiplier of k=3 is used, representing a 99% confidence interval. In each case, the dual electrode configuration provided significantly improved limits of detection. In the case of both Cu and Pb, the limit of detection is sub ppt, on par with many commercial ICP-based instruments.

Isotope Ratio Measurement Precision

In order to test the ability of the LS-APGD device 300 to conduct high precision isotope ratio measurement, a test solution containing CRM-129a ($^{235}$U/$^{238}$U=0.0072614) was analyzed, and the results are shown in Table 2.

TABLE 2

| LS-APGD device 300 | | | | LS-APGD device 100 | | |
|---|---|---|---|---|---|---|
| $^{235}$U | $^{238}$U | $^{235}$U/$^{238}$U | | $^{235}$U | $^{238}$U | $^{235}$U/$^{238}$U |
| 71127.91 | 10370141 | 0.006859 | | 4598.601 | 676686.3 | 0.006796 |
| 66465.68 | 9701298 | 0.006851 | | 6468.649 | 950522.5 | 0.006805 |
| 77236.99 | 11265294 | 0.006856 | | 5556.588 | 816660.3 | 0.006804 |
| | | 0.006855 | Average | | | 0.006802 |
| | | 3.9E−06 | St Dev | | | 5.2E−06 |
| | | 0.057 | % RSD | | | 0.076 |

The results were also compared to results taken using the LS-APGD device 100. Based on the measurements, there is improvement in the measurement precision between the LS-APGD devices 100, 300. Also, improvement in accuracy is realized when using the LS-APGD device 300. These results indicate further improvements can be achieved.

Thus, the LS-APGD device 300 takes advantage of increased energy and plasma volume to effect ionization, via using multiple electrodes and power supplies. Significant increases in both sensitivity and response of over an order of magnitude are realized, and a reduction in background ions is also observed. The LS-APGD device 300 samples a larger, uncontaminated portion of the plasma with fewer concomitant and interferent ions present, which lead to the improvements. In particular, the LODs obtained with the LS-APGD device 300 can be similar to LODs typically only achievable using more complex and costly inductively coupled plasma sources.

Additional Embodiments

FIG. 13 is an example LS-APGD system 1300 configured to selectively deliver power to different electrodes at different times and to provide an auto-ignition to generate a glow discharge plasma. It will be appreciated that such capabilities need not be present in the same device and can be applied to various LS-APGD devices independently of each other. The LS-APGD system 1300 can include a hardware platform, such as a computing device 1302, to facilitate LS-APGD operation as an ion source 1304 and interconnection with an analytical instrument, such as a mass spectrometer 1306. In general, FIG. 13 and the following discussion are intended to provide a brief, general description of an exemplary computing/control environment in which the disclosed LS-APGD technology may be implemented. Although not required, the disclosed technology is described in the general context of computer-executable instructions, such as program modules, being executed by a computing unit, dedicated processor, or other digital processing system or programmable logic device. Generally, program modules include routines, programs, objects, components, data structures, etc., that perform particular tasks or implement particular abstract data types. Moreover, the disclosed technology may be implemented with other computer system configurations, including hand-held devices, personal computers (PCs), multiprocessor systems, microprocessor-based or programmable consumer electronics, network PCs, minicomputers, mainframe computers, dedicated processors, MCUs, PLCs, ASICs, FPGAs, CPLDs, systems on a chip, and the like. The disclosed technology may also be practiced in distributed computing environments where tasks are performed by remote processing devices that are linked through a communications network. In a distributed computing environment, program modules may be located in both local and remote memory storage devices. In some examples, the hardware platform controlling the ion source 1304 can be incorporated as part of the mass spectrometer 1306.

With reference again to FIG. 13, an exemplary system for implementing the disclosed technology can include the computing device 1302, which can include one or more processing units 1308 and memories 1310 coupled together with a system bus which also couples various other system components. System bus structures may be of any suitable type including a memory bus or memory controller, a peripheral bus, a local bus, etc. The memory 1310 can include various types, including volatile memory (e.g., registers, cache, RAM), non-volatile memory (e.g., ROM, EEPROM, flash memory, etc.), or a combination of volatile and non-volatile memory. The memory 1310 is generally accessible by the processing unit 1308 and can store software in the form computer-executable instructions that can be executed by the one or more processing units 1308 coupled to the memory 1310. In some examples, processing units can be configured based on RISC or CISC architectures, and can include one or more general purpose central processing units, application specific integrated circuits, graphics or co-processing units or other processors. In some examples, multiple core groupings of computing components can be distributed among system modules, and various modules of software can be implemented separately.

The computing device 1302 can further include one or more storage devices such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus by a hard disk drive interface, a magnetic disk drive interface, and an optical drive interface, respectively. The drives and their associated computer-readable media provide nonvolatile storage of computer-readable instructions, data structures, program modules, and other data for the computing device 1302. Other types of non-transitory computer-readable media which can store data that is accessible by a PC, such as magnetic cassettes, flash memory cards, digital video disks, CDs, DVDs, RAMs, ROMs, and the like, may also be used in the exemplary computing environment. The storage can be removable or non-removable and can be used to store information in a non-transitory way and which can be accessed within the computing environment.

As shown in FIG. 13, the computing device 1302 is coupled through input/output (I/O) 1312 to one or more power supplies 1314A-1314D, such as an A/C power supply (up to RF frequencies) and/or DC power supply configured with voltage and/or current sources. In DC examples, current direction can be to or from an electrode. The power supplies 1314A-1314D are in electrical communication with respective electrodes to provide power to generate a plasma in an LS-APGD reaction volume 1316. For example, power supplies 1314A, 1314C can be coupled to respective counter electrodes 1318, 1320 that are arranged with ends directed at the LS-APGD reaction volume 1316 in a predetermined relationship with respect to a mass spectrometer ion inlet 1322, through plasma generated ions can be coupled out of the ion source 1304 and into the mass spectrometer 1306, and with respect to one or more capillaries 1324 configured to flow at least an analyte into the LS-APGD reaction volume 1316. One, two, three, or more counter electrodes may be used in different examples. Power supply 1314B can be coupled to an aperture housing of the ion inlet 1322. In some examples where the ion inlet 1322 includes an electrode, other counter electrodes such as the counter electrodes 1318, 1320, can be omitted. Power supply 1314D can be coupled to one or more of the capillaries 1324 in selected embodiments. Depending on the LS-APGD operation modality, different electrodes can be held at a ground potential. In an example, a solution electrode of the capillaries 1324 is held at a ground potential of power supply 1314C and power supplies 1314A, 1314B, 1314D are omitted. In a related example, the solution electrode is at a selected non-ground potential with the power supply 1314D and the counter electrode 1318 is held at a ground potential and power supplies 1314A-1314C are omitted. In a representative example, separate power supplies 1314A, 1314C provide separate time-dependent voltages and/or currents to counter electrodes 1320, 1318 and a solution electrode of the capillaries 1324 is held at a ground potential. Power supplies 1314A-1314D can also be combined into a single unit or mixed among different power supply units and can be referred to as a multi-modal power supply. The I/O 1312 can also be coupled to one or more pumps and/or valves 1326 controlling analyte and/or electrolyte flow through the capillaries 1324 into the LS-APGD reaction volume 1316, and to one or more pumps and/or valves 1328 controlling a flow of sheath gas into the LS-APGD reaction volume 1316. In some examples, one or more of the counter electrodes 1318, 1320 can correspond to a discharge end of a capillary introducing gas analyte, aerosolized solid analyte, or liquid electrolyte. A capillary at the counter electrodes 1318, 1320 can also introduce a sheath gas in addition to an analyte or electrolyte.

During operation, the computing device 1302 can control the generation of plasma in the LS-APGD volume 1316, using different automated routines stored in the memory 1310. For example, an auto-ignition routine can be stored in a memory 1330A and can include a voltage application sequence to one or more electrodes that is different from a normal plasma generation voltage applied to the same electrode. The different voltage application can allow the plasma to be generated initially without requiring physical translation and contact of anode and cathode electrodes at their different respective voltages. Thus, representative examples using auto-ignition can include electrodes retained in fixed, spaced apart, positions relative to the LS-APGD reaction volume 1316 and other electrodes (though being fixed is not a requirement) of the ion source 1304. Suitable auto-ignition voltages typically include one or more voltages higher than a steady-state plasma generation voltage and can be selected based on a spacing between the electrodes with larger spacings typically requiring larger voltages. Auto-ignition voltages can be pulsed at one or more selected duty cycles and periods which can be constant or varying for a duration of the auto-ignition sequence. Auto-ignition voltage sequence parameters can vary based on mode of operation of the ion source 1304 or type of analyte, analyte and/or sheath gas flowrates, etc. Voltage amplitudes, periods, duty cycles, and durations can be selected and varied to determine suitable values. Auto-ignition can be applied to any of the examples described herein, as well as prior LS-APGD systems and apparatus, and can allow electrodes to remain in a fixed position or without electrode contact, which can improve day to day consistency and precision of ion source operation. A particular advantageous combination can include the use of the integrated holder 700 along with auto-ignition to allow for greater day to day reproducibility and greater reproducibility after performing routine maintenance while also providing enhanced operational safety to the user (including by way of example, a reduced need for a user to reset or re-align electrodes).

Typically, the target capabilities of a mass spectrometry instrument are chosen based very specifically on the application, with determining factors including the physical form of the sample, the chemical identity of the analytes, and the complexity of its constituent makeup. Such factors can affect the type of ionization source selected, and the modality of mass separation. Pre-separation of constituents is common and can be performed by gas or liquid chromatography or electrophoresis, by way of example. Mass spectrometer platforms are typically chosen based primarily on the required mass range and resolution, with the choice of the ionization source being of primary concern, and for which there are several in common use today. In choosing an ionization source, one primary consideration is its efficacy of producing organic/molecular versus elemental/isotopic types of information. Indeed, these families of analyses are often virtually exclusive of one another, requiring very different ionization sources. Low molecular weight organic molecules are generally volatile, and can be ionized by gas phase collisions with electrons (electron ionization (EI)) or through addition/subtraction of charge via one of many chemical ionization (CI) processes). As molecular weights increase, the volatility of those molecules decreases dramatically. As such, the ionization processes must involve some sort of desorption step, placing the analytes into the gas phase. The ionization step in such analyses typically happens in the condensed phase or in the course of expulsion. The most common of the methods are matrix assisted laser desorption ionization (MALDI) and electrospray ionization (ESI). Whichever process, the ionization of a molecule must occur with energy input that is below the levels which would create the disintegration of the molecule and obvious loss of molecular signatures that provide identity, structure, and chemical reactivity information. On the other end of the energy spectrum, if the required information of the analysis is elemental composition and concentration, and perhaps isotopic ratios, the primary analytes must be broken down from bound or molecular form to free atoms and ions. This requires the input of sufficient energy to totally dissociate molecules. Examples of common atomic sources including the inductively-coupled plasma source (ICP). An inert gas plasma sustained at ~2 kW of rf power, with argon flow rates of ~16 L min$^{-1}$. The ICP accepts analytes in the solution and gas phases, or particles created by a number of methods. While the required mass range of "elemental" MS instruments is limited to <300 Da and also requires relatively modest mass resolution, the vacuum pumping requirements for such instruments are orders of magnitude more challenging than those ionization sources for organic MS, which also operate at atmospheric pressure. Due to the apparent disparity in ion source requirements for the two analytical applications, examples of the disclosed technology fill the void where there are no MS ionization source/mass analyzer platforms which allow both elemental and molecular species analysis. Thus, disclosed examples can provide the multi-modal capability of direct interfacing and high quality operation in an elemental MS mode on platforms designed for molecular mass spectrometry. As discussed above, samples can be introduced as solutions, in the gas phase, or introduced from the solid state by multiple methods. Also, in particular examples herein, LS-APGD devices can be operated in power regimes which provide both molecular mass spectra from inorganic and organic species. As demonstrated hereinabove, device examples can provide efficacy for molecular applications and elemental/isotopic applications, including with the ability to measure isotope ratios at precision of better than 0.05% RSD, and at MS resolution of over 1M with Orbitrap MS systems. Furthermore, LS-AGPD examples can operate at a lower power regime, reducing complexity and cost while being adaptable to existing MS platforms. By retrofitting organic MS instruments with microplasma ion sources, levels of performance not far removed from ICP-MS instruments can be achieved at a substantially lower cost and without heavy vacuum requirements or dedicated operators.

The ion source 1304 can be configured as multi-modal to provide different modes of operation and/or different power supply modal selections, with different operation routines and instructions stored in the memory 1310. For example, a power supply modal selection routine can be stored in a memory 1330B to selectively control the power supplies 1314A, 1314C to operate so that only one of the counter electrodes 1318, 1320 is powered to generate plasma in the LS-APGD plasma volume 1316 during the entirety of an analysis window or at different times during an analysis window. Such selection can be configured based on selected ions desired to be extracted from an analyte and coupled to the mass spectrometer, e.g., where an improved limit of detection can be obtained for a selected species or an increased ion generation or selection efficiency can be obtained for certain species, including molecular vs. atomic species. Selection of an atomic or molecular species, or other types or characteristics, can be controlled with an atomic/molecular selection stored in a memory 1330C. For example, based on input parameters associated with desired mass spectrometer analysis capabilities, different multi-modal operation routines stored in the memory 1330B can be retrieved (e.g., with a look-up table) and applied during the LS-APGD ion source generation. Thus, by selectively controlling to multiple electrodes, specific ion source examples can provide a combined atomic/molecular (CAM) ionization source. By enabling ionization and hence detection/analysis of both atomic and molecular species, complex analytical samples can be analyzed in various mass spectrometers coupled to the ion source. Thus, some examples of the disclosed technology can eliminate the need for separate elemental/isotopic and organic/molecular ion sources on separate mass spectrometer systems or could allow existing "organic" MS systems to function in either mode. Examples can allow for comprehensive environmental and biological sample characterization to be performed in a cost-effective manner. Further examples can apply such multi-modal plasma generation capabilities for applications other than mass spectrometers, such as simple current detection, ion beam generation, processing, or deposition.

FIG. 14 shows a graph of an example voltage sequence used to generate an LS-APGD plasma. At a time $T_{AUTO}$, a pulsed auto-ignition sequence initiates and applies a voltage to an electrode that alternates between a high voltage $V_{AUTO}$ and 0 V at a 50% duty cycle with a selected period. Example periods can include 1 s, 0.1 s, 0.01 s, 1 ms, 1 μs, etc., and other example duty cycles can include 90%, 10%, 1%, 0.1% etc. Other duty cycles and periods can be selected, including ones that vary of the auto-ignition sequence. While five cycles are shown, fewer (including one) or more cycles can be used. More complex waveforms may be selected as well. Suitable voltages for $V_{AUTO}$ can include 100 V, 200 V, 400 V, 1 kV, 5 kV, etc. At a time $T_{STEADY,MODE1}$, the voltage applied to the electrode is provided at $V_{MODE1}$, which is typically substantially smaller than the voltage $V_{AUTO}$. Suitable voltages for $V_{MODE1}$ can include 0 V, 20 V, 50 V, 100 V, 150 V, 200 V, etc. In representative examples, one or more resistive elements are in-line with the electrode to determine a current for generating plasma, such as 0 mA, 5 mA, 10 mA, 20 mA, 30 mA, 50 mA, 100 mA, etc. At a time $T_{STEADY,MODE2}$, the voltage applied to the electrode is provided at $V_{MODE2}$, which can be at a larger or smaller different voltage from at $V_{MODE1}$. In other examples, a current can be adjusted by varying a resistance at the same voltage. In further examples, current can be controlled via one or more current sources of respective power supplies and voltage changed via the current sources. It has been found generally that greater plasma temporal stability is achieved by operating the power sources in a constant-current mode. In representative examples, alternative modes correspond to a quantity of active counter electrodes supplying current to or sinking current from the reaction volume. For example, as discussed above in the experiments section, one mode can correspond to providing a predetermined amount of current (e.g., 30 mA) through a counter electrode, and a second mode can correspond to providing a predetermined separate amount of current (e.g., 30 mA) through another counter electrode. Examples can include increasing or decreasing a total current in the reaction volume or alternating among the active electrodes.

FIG. 15 is an example method 1500 for automatically igniting a plasma in an LS-APGD reaction volume defined by a relationship by a plurality of electrodes so as to form an ion source. Plasma generated in the reaction volume can include ions formed from a supplied analyte and coupled into an ion inlet corresponding to an ion inlet of a mass spectrometer or other analysis instrument or reservoir. It will be appreciated that various devices, including ion guides and funnels, traps, drift tubes, etc., may be coupled between an LS-APGD reaction volume and a mass spectrometer. The automatic ignition can be performed with electrodes with discharge ends directed into the reaction volume and arranged in a fixed relation to one another. Some examples can include automatic ignition parameters that may be adjusted for alternative fixed positions of the electrodes, such as positions defining a larger, differently shaped, or differently oriented reaction volume. At 1502, the mass spectrometer or other instrument configured to receive LS-APGD generated ions is initiated. Typically, the instrument is under vacuum such that a pressure differential between the reaction volume and the instrument causes the ions to flow with air and/or introduced gas to the ion inlet. Electrostatic potentials and fields are also typically employed to direct or focus ions into the mass spectrometer inlet. At 1504, an analyte (and typically a sheath gas) is flowed into the reaction volume of the ion source. At 1506, an auto-ignition sequence is initiated to produce an electrical discharge through the electrodes so that the plasma is produced. To determine the characteristics of the auto-ignition sequence, at 1508, process parameters may be provided by a user, such as analyte parameters and/or atomic/molecular characteristics for ions desired to be produced. At 1510, an auto-ignition sequence associated with the provided parameters can be selected, and the auto-ignition sequence can be performed on the reaction volume at 1512. For example, auto-ignition sequences can include increased and/or pulsed or cycled voltage waveforms as compared to a steady-state plasma generation voltage, and voltage waveforms can be adjusted based on electrolyte concentration, analyte characteristics including analyte state (e.g., aerosolized solid, gas phase analyte, liquid analyte, etc.), concentration, or type, gas flowrates, plasma volume dimensions, electrode gap distance(s) (typically where larger distances require larger voltages), etc. Voltage waveform adjustments can include varying voltage amplitude, period, duty cycle, number of cycles, bursts of cycles, number of bursts, etc. At 1514, if the auto-ignition is complete, the LS-APGD plasma generation process can proceed to a steady state mode, 1516. In some examples, a sensor such as a photodiode can be coupled to the reaction volume and provide feedback to determine whether the auto-ignition is successful and therefore complete. Example electrode arrangements can include one or more electrodes that perform auto-ignition separate from steady state LS-APGD plasma generation or one or more electrodes that perform both auto-ignition and steady state sequences. In examples with multiple electrodes, different electrodes can be powered in a sequence during an auto-ignition sequence.

FIG. 16 shows a graph of a voltage sequence 1600 during active plasma generation along with a flowrate sequence 1602. Thus, during plasma generation, some modal plasma control can include varying a plasma power in a stepwise manner such as with a constant voltage step (such as shown in FIG. 14) and varying power in more complex manner, including a periodic manner such as that shown with the voltage oscillations between $V_{MODE1}$ and $V_{MODE2}$ in FIG. 16. It will be appreciated that various complex variations in plasma power characteristics are possible, including ramp, exponential, sinusoidal, curved, etc. In additional examples, a flowrate of one or more of analyte, electrolyte (if separately provided), or an internal standard can also be varied in a stepwise or complex manner. As shown, the flowrate sequence 1602 varies in the form of an oscillation between $n_{MODE1}$ and $n_{MODE1}$ which is synchronized with the variation in the voltage sequence 1600. Other synchronizations are possible, including with time delays, higher or lower frequencies, amplitude variations, etc. Flowrate sequences that are not synchronized with voltage sequences are also possible. By synchronizing or locking into the frequency of the internal standard, noise effects associated with the mass spectrometer detection of the analyte can be further reduced or eliminated.

Figure 17A:
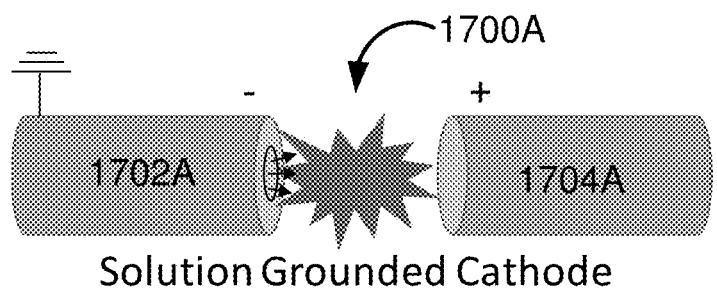
Figure 17B:
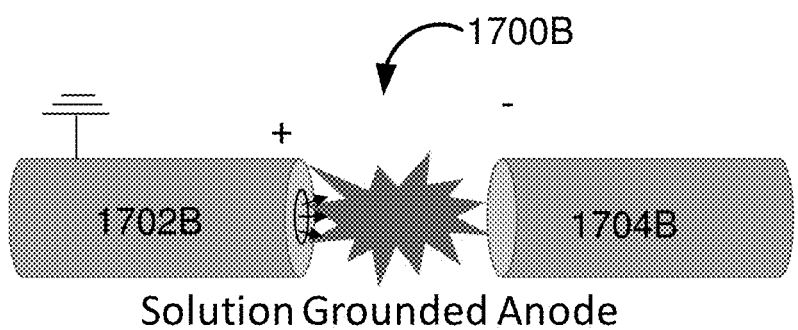
Figure 17C:
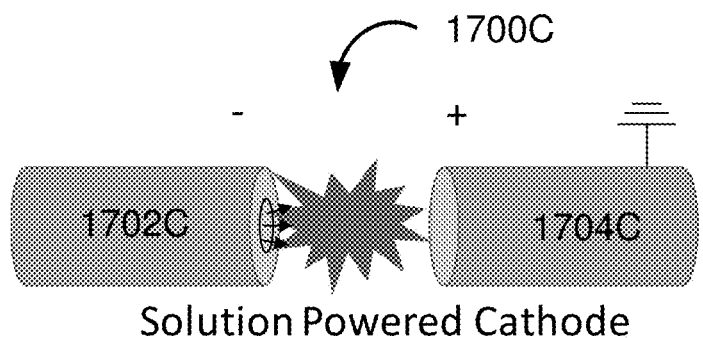
Figure 17D:
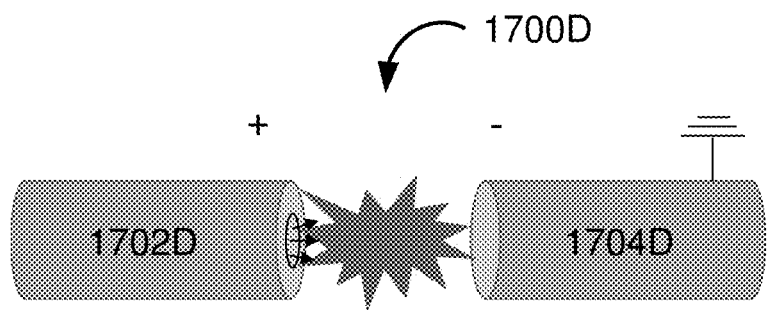

FIGS. 17A-17D show LS-APGD reaction volumes 1700A-1700D under different discharge scenarios between anode and cathode (with the electrode at a more negative potential serving as the cathode). FIG. 17A shows a solution electrode 1702A corresponding to a solution grounded cathode, adjacent to a counter electrode 1704A corresponding to an anode at a positive electric potential. FIG. 17B shows a solution electrode 1702B corresponding to a solution grounded anode, adjacent to a counter electrode 1704B corresponding to a cathode at a negative electric potential. FIG. 17C shows a solution electrode 1702C corresponding to a solution powered cathode, adjacent to a counter electrode 1704C corresponding to an anode at a grounded electric potential. FIG. 17D shows a solution electrode 1702D corresponding to a solution powered anode, adjacent to a counter electrode 1704D corresponding to a cathode at a grounded electric potential. Ground potentials typically correspond to a potential at or near a zero or earth reference potential, but other non-zero potentials may be used. In general, each discharge scenario can be applied to the various embodiments described herein.

FIG. 18 is an example method 1800 of multi-modal LS-APGD ion generation. At 1802, a user can input various parameters associated with the ion characteristics desired to be produced or identified with a mass spectrometer, including analyte characteristics, atomic species selection, molecular species selection, ion size, mass, charge, m/z ratio, etc. At 1804, these parameters can be used or mapped to a selected multi-modal plasma generation voltage and/or current profile. In representative examples, the selected multi-mode profile can include control instructions for selective powering of different electrodes at different times and/or different durations. For example, a control signal can be sent to one or more power supplies coupled to the electrodes and relays or other power control mechanisms can be used to selectively power the different electrodes with different voltages and/or currents. At 1806, the power sequence can be applied to the electrodes to generate the desired ions in an LS-APGD reaction volume. If coupled to a mass spectrometer, at 1808, the generated ions can then be directed through an ion source inlet to the mass spectrometer.

As discussed above, dynamic control over electrode operation can provide multi-modal performance with coupled mass spectrometers, or other ion-related applications. The enhanced performance obtained through the use of multiple counter electrodes has been found to be counterintuitive. For example, it has been found that electrical discharge generally occurs across a path of least resistance, and it is preferable that such electrical discharge not vary over time to maintain plasma stability. However, by generally including effectively a maximum number of multiple electrodes arranged perpendicularly to a solution electrode, such as in the form of a ring or washer, a plasma is formed that tends to circulate the reaction volume searching for a path of least resistance, and this circulation results in substantial instability. But, a current circulation or related instability is not observed in the multiple counter electrode examples where each power source is operating in a constant-current mode, and advantageously a higher current density is allowed without melting of the central capillary. For example, providing above about 40 mA with a single solution electrode and single counter electrode can result in melting or degradation the capillary supporting the solution electrode. However, by operating two separate counter electrodes at 30 mA each, the capillary remains cooler, and due to the positioning of the counter electrodes, the plasma being generated is better anchored in the reaction volume and hence more stable. Additional advantages can then be provided through the separate control of the electrodes as discussed above. For example, in dual counter electrode arrangements, if powered one at a time, the mass spectra tend to show reduced fragmentation as molecules stay more intact during plasma generation, and the second counter electrode is added, molecules are more likely to break down into their constituent atomic or molecular components. Thus, by powering different numbers of electrodes or to different extents, mass spectra can be changed, manipulated, or tailored based on analytical response characteristics desired by a user.

Adjusting counter electrode selection and/or power can control the degree of ionization for the ions produced from the analyte in the plasma. For example, it has been found that the sequence and extent of powering the plasma controls the amount of energy put into the plasma and this energy quantity can become a significant consideration in determining the type of ionization that is produced. By adding electrodes, the plasma volume tends to increase and with a larger plasma, an analyte can spend a longer duration in the plasma thereby increasing a degree of ionization. It has also been found that molecular species from the air can become entrained in the plasma and present interferences in mass spectra. The larger plasma that is produced with additional counter electrodes can increase a chance of maintaining atmospheric species outside of the plasma, thereby decreasing a degree of ions of those species causing interference and noise in the mass spectra. The larger plasma can also be more robust by being more physically stable, more resistant to sample and/or flowrate variations, and less likely to be affected or extinguished by minor sample or operational perturbations. Solution or ambient gas species can be more effectively dissociated in the more robust plasma, providing more consistent and reliable mass spectra and analytical results. Thus, various examples of the disclosed technology can provide higher sensitivity, greater reproducibility, lower detection limits, improved linearity and calibration ease, greater freedom from carryover (interference or memory from prior samples or use), greater freedom from extraneous and undesired atmospheric constituent interferences, improved ion source interfacing and coupling options, and more freedom and flexibility in integrating an ion source with different mass spectrometer systems or for specialized applications or tandem system use (e.g., with laser ablation, chromatography, etc.).

The potential benefits of operating in a modality such as depicted in the scheme of FIG. 18 are shown in FIGS. 21A & 21B. In the first case shown in FIG. 21A, a multielement solution is provided into an example of the LS-AGPD device 300, operating with either a single or both counter electrodes powered at a current of 30 mA. The respective spectra reveal pronounced changes in composition as the single electrode mode yields a large number of spectral peaks representative of background components likely related to the aqueous sample solution and ambient atmospheric species. Utilization of the dual-electrode powering mode results in the near-elimination of such species, will multiple-times increase in the target atomic ion signals. The corresponding experiment performed on the common mass spectrometry molecular model compound, caffeine, displays equally profound results. As seen in FIG. 21B, the spectrum acquired in the singular counter-electrode mode closely resembles that expected from a typical chemical ionization source, composed predominately of the protonated molecular ion (M+H). Implementation of the dual counter electrode powering mode yields appreciably more fragmentation, more closely resembling that of an electron ionization source. Each type of information can be useful and valuable, and some embodiments can allow for both types of information to be obtained from the same type of LS-APGD ion source, operated in different modes.

FIGS. 19-20 illustrate the statistical significance (using the logworth function) of the impact of varying different LS-APGD parameters, including liquid flowrate, electrode gap distance, current, and combinations, on detection performance of a mass spectrometer receiving the plasma generated ions, for an example of the single (solution), integrated-electrode embodiment 200. In the first case, the response for the desired atomic analyte signals is plotted, with their respective signal-to-background characteristics shown in the second case. In general, a logworth value greater than 2 presents statistical significance. Thus, while small changes to liquid flow and current values affect performance in the single electrode embodiment, small variations in liquid flow and electrode gap, including at smaller and larger values, can have relatively little effect on the performance of the single (solution) electrode embodiment. An associated freedom from appreciable parametric dependencies can be an advantage of some examples with a single (solution) electrode configuration.

FIG. 22 is a graph illustrating the effect of displacement of the counter electrodes of an example of the LS-APGD device 300 relative to a solution axis on mass spectrometer detection performance of an Advion model compact mass spectrometer (CMS). As can be seen from the graph, the positioning of the axis between the counter electrodes relative to the solution electrode exit point can be a significant control element. Positions more distance from the solution exit yield fewer analyte ions, with a maximum obtained where the axis of the counter electrodes intersects the tip of the solution capillary. The signal decreases yet again as the counter electrodes are moved farther from the solution capillary exit. FIG. 23 is a graph illustrating the effect of varying distance between a capillary output and an ion inlet orifice upon mass spectrometer detection performance. Thus, for different electrode arrangements, an optimal distance can be selected where peak detection performance may be obtained. In some examples, different holders and associate electrode arrangements can include fine translation control (e.g., with a set screw) to adjust a distance between an analyte output and orifice inlet. Where detection performance varies based on modal selection, translation can be effected for different modal selections (including automatically, e.g., with a motorized servo). FIG. 24 is a graph illustrating the effect of sheath gas flow rate on detection performance. Thus, higher flowrates tend to reduce analyte detection performance for many species, though may improve detection performance in some species. As with variation in electrode power application, LS-APGD modal selection can also include variation of a gas flowrate based on selected species targeted for detection.

FIGS. 25A-25C show an LS-APGD cartridge device 2500 that can be secured to a receiving structure 2502 and ion inlet 2504 of an ion analyzer instrument such as a mass spectrometer. As shown in FIG. 25A, the LS-APGD device 2500 includes a body 2506 shaped to correspond to an interior wall 2508 of the receiving structure 2502. The interior wall 2508 can include tabs, detents, or other surfaces and fastening mechanisms configured to receive one or more surfaces 2509 of the body 2506 to position an electrode arrangement 2510 of the LS-APGD device 2500 in a predetermined location 2512 in relation to the ion inlet 2504. In some examples the receiving structure 2502 is an existing structure of the ion analyzer instrument and in other examples the receiving structure 2502 can be a retrofit attachment for the ion analyzer instrument. In some examples, the body 2506 can be 3D printed. The LS-APGD device 2500 can include electrical connector ports 2514a, 1514b that can couple electricity to counter electrodes 2516a, 2516b of the electrode arrangement 2510. Liquid analyte and sheath gas ports 2518, 2520 can be coupled to an analyte sample stream and a gas respectively. In the body 2506, the analyte and gas can be coupled to inner and outer capillary portions of a capillary 2522 so that analyte and gas can be injected into an LS-APGD reaction volume 2524 during active operation of the LS-APGD device 2500. During operation, gas and plasma generated ions can be directed through the ion inlet 2504.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest," "best," "minimum," or the like. It will be appreciated that such descriptions are intended to indicate that a selection among many used functional alternatives can be made, and such selections need not be better, smaller, or otherwise preferable to other selections.

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

We claim:

1. An apparatus, comprising:
an atmospheric pressure glow discharge (APGD) analyte electrode defining an analyte discharge axis into an APGD volume; and
a plurality of APGD counter electrodes having respective electrical discharge ends directed to the APGD volume;
wherein the APGD analyte electrode and the APGD counter electrodes are configured to produce an APGD plasma in the APGD volume with a voltage difference between the APGD analyte electrode and one or more of the APGD counter electrodes.

2. The apparatus of claim 1, wherein the plurality of APGD counter electrodes includes first and second APGD counter electrodes opposing each other with the respective ends arranged along respective counter electrodes axes that intersect each other and the analyte discharge axis.

3. The apparatus of claim 2, wherein the counter electrode axes are collinear and perpendicular to the analyte discharge axis.

4. The apparatus of claim 2, wherein the plurality of APGD counter electrodes includes third and fourth APGD counter electrodes opposing each other with the respective ends arranged along respective counter electrodes axes that intersect each other and the analyte discharge axis.

5. The apparatus of claim 4, wherein the counter electrode axes of the first and second electrodes are collinear and perpendicular to the analyte discharge axis and the counter electrode axes of the third and fourth electrodes are collinear and perpendicular to the analyte discharge axis and the counter electrodes axes of the first and second electrodes.

6. The apparatus of claim 1, further comprising:
a first capillary configured to discharge the analyte into the APGD volume; and
a second capillary configured to discharge an electrolyte into the APGD volume.

7. The apparatus of claim 6, wherein the APGD analyte electrode is formed as a portion of the first capillary and one of the APGD counter electrodes is formed as a portion of the second capillary.

8. The apparatus of claim 1, further comprising a capillary including the APGD analyte electrode formed as a portion of the capillary, wherein the capillary is configured to discharge the analyte as a gas analyte or aerosolized analyte into the APGD volume.

9. The apparatus of claim 1, wherein at least one of the APGD analyte electrode or APGD counter electrodes is movable so as to vary a characteristic of the APGD volume.

10. The apparatus of claim 1, further comprising:
a power supply electrically coupled to at least one of the APGD analyte electrode or APGD counter electrodes and configured to power the at least one electrode to produce an APGD plasma in the APGD volume; and
an ion inlet coupled to the APGD volume and situated to receive ions generated in the plasma.

11. The apparatus of claim 1, wherein the electrical discharge ends are arranged to reduce a washout time of the apparatus.

12. The apparatus of claim 1, wherein the APGD analyte electrode and the APGD counter electrodes are configured to produce a non-APGD analyte excitation for optical emission spectroscopy.

13. The apparatus of claim 1, further comprising an outer capillary configured to discharge a sheath gas, wherein the APGD analyte electrode is formed on the outer capillary; and
an inner capillary surrounded by the outer capillary and configured to discharge the analyte into the APGD volume.

* * * * *

UNITED STATES PATENT AND TRADEMARK OFFICE
CERTIFICATE OF CORRECTION

PATENT NO. : 11,366,066 B2
APPLICATION NO. : 16/600363
DATED : June 21, 2022
INVENTOR(S) : Koppenaal et al.

It is certified that error appears in the above-identified patent and that said Letters Patent is hereby corrected as shown below:

In the Specification

Column 3, Line 65 "extends over the APGD to volume so as" should read --extends over the APGD volume so as--

Column 7, Line 6 "include, environmental siderophores" should read --include environmental siderophores--

Column 11, Lines 36-37 "electricity can coupled to" should read --electricity can be coupled to--

Column 14, Line 24 "were simultaneous measured," should read --were simultaneously measured,--

Column 23, Line 19 "degradation the capillary supporting" should read --degradation of the capillary supporting--

Column 24, Lines 15-16 "will multiple-times increase" should read --with multiple-times increase--

Signed and Sealed this
Twenty-third Day of April, 2024

Katherine Kelly Vidal
*Director of the United States Patent and Trademark Office*